United States Patent
Adachi et al.

(10) Patent No.: US 10,847,982 B2
(45) Date of Patent: Nov. 24, 2020

(54) BATTERY CONTROL SYSTEM

(71) Applicant: DENSO CORPORATION, Kariya (JP)

(72) Inventors: Norikazu Adachi, Kariya (JP); Tomoki Yamane, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/201,687

(22) Filed: Nov. 27, 2018

(65) Prior Publication Data

US 2019/0165586 A1    May 30, 2019

(30) Foreign Application Priority Data

Nov. 28, 2017 (JP) .................................. 2017-228218

(51) Int. Cl.
| | |
|---|---|
| *H02J 7/00* | (2006.01) |
| *H01M 10/48* | (2006.01) |
| *G01R 31/389* | (2019.01) |
| *G01R 31/387* | (2019.01) |
| *H01M 2/34* | (2006.01) |

(52) U.S. Cl.
CPC .......... *H02J 7/0029* (2013.01); *G01R 31/387* (2019.01); *G01R 31/389* (2019.01); *H01M 2/348* (2013.01); *H01M 10/482* (2013.01); *H01M 10/486* (2013.01); *H02J 7/0068* (2013.01); *H01M 2200/10* (2013.01)

(58) Field of Classification Search
CPC .. G01R 31/389; G01R 31/387; G01R 31/388; G01R 31/374; H01M 2/348; H01M 2200/10; H02J 7/00; H02J 7/00036; H02J 50/80; H02J 50/10; H02J 7/0004; A61N 1/3787
USPC ................................ 320/103, 134-136, 150
See application file for complete search history.

(56) References Cited

U.S. PATENT DOCUMENTS

| | | | |
|---|---|---|---|
| 2008/0204031 A1* | 8/2008 | Iwane | G01R 31/389 324/430 |
| 2010/0079111 A1* | 4/2010 | Masuda | H01M 10/486 320/134 |
| 2018/0069272 A1* | 3/2018 | Seo | B60L 58/24 |
| 2018/0183249 A1* | 6/2018 | Adachi | H01M 10/46 |
| 2019/0170830 A1* | 6/2019 | Ohkanda | G01R 31/389 |

FOREIGN PATENT DOCUMENTS

| | | |
|---|---|---|
| JP | 2016-093066 A | 5/2016 |
| JP | 2017-111860 A | 6/2017 |

\* cited by examiner

*Primary Examiner* — Nghia M Doan
(74) *Attorney, Agent, or Firm* — Oliff PLC

(57) ABSTRACT

A battery control system including a secondary battery within which gas is generated with use, and a controller configured to control charging/discharging of the secondary battery. In the controller, a measurer is configured to measure a resistance of the secondary battery, and a stop director is configured to stop charging/discharging of the secondary battery when the resistance of the secondary battery has exceeded a predetermined resistance threshold.

10 Claims, 22 Drawing Sheets

BATTERY CONTROL SYSTEM

CROSS-REFERENCE TO RELATED APPLICATION

This application is based on and claims the benefit of priority from earlier Japanese Patent Application No. 2017-228218 filed on Nov. 28, 2017, the description of which is incorporated herein by reference.

BACKGROUND

Technical Field

The present disclosure relates to a battery control system including a secondary battery and a controller that controls charging/discharging of the secondary battery.

Related Art

Conventionally, a battery control system is known, which includes a secondary battery and a controller that controls charging/discharging of the secondary battery (see JP-A-2016-93066). The secondary battery (hereinafter also referred merely to as a battery) includes a Li-ion battery, a Na-ion battery or the like. With repeated charging and discharging cycles, gas may be generated within the battery. A casing of such a battery includes a valve for releasing the gas generated. When gas is generated during repeated charging and discharging cycles and a pressure within the casing has increased, the valve opens to release the gas. This can reduce failure, such as expansion of the casing caused by the gas pressure.

However, opening of the valve may cause unusual odor or leak of electrolyte. The above battery control system is configured to stop charging/discharging of the battery prior to opening of the valve. To this end, for example, the following measure is employed.

A temperature and a state of charge (SOC) are measured and stored over a period of time. In a case where a temperature of the use circumstance is high or the SOC of the battery is kept at a high level, gas is likely to be generated within the battery and an internal pressure is accordingly likely to increase. Therefore, there is a certain relationship between history of the temperature or the state of charge or the like and the internal pressure of the battery. The internal pressure of the subject battery can be estimated using such history information of the temperature, the state of charge or the like. When this estimated internal pressure has reached a predetermined level, a determination to stop charging/discharging of the battery is made.

However, the reliability of a determination as to whether to stop charging/discharging of the battery made by the battery control system is low. This is because use of history of the temperature and the state of charge of the battery requires long term measurement of the temperature and the state of charge of the battery. Should such history information be erased due to any defect, an internal pressure could not be estimated, preventing making a determination as to whether to stop charging/discharging of the battery. Even if the temperature of the battery can be measured over a period of time, a copious amount of measurement data will be generated. It is difficult to estimate an accurate value of internal pressure from such copious amount of measurement data.

Thus, a value of internal pressure estimated by the above battery control system is considered less accurate and a determination as to whether to stop charging/discharging of the battery made by the above battery control system is considered less reliable. For example, in a case where an internal pressure is incorrectly estimated as low despite an actual internal pressure being high, the above battery control system may determine not to stop charging/discharging of the battery, so that the valve may open and unusual odor may occur. In a case where an internal pressure is incorrectly estimated as high despite an actual internal pressure being low, the above battery control system may determine to stop charging/discharging of the battery.

In view of the above, it is desired to have a battery control system that can increase the reliability of a determination as to whether to stop charging/discharging of a battery.

SUMMARY

A first aspect of the disclosure provides a battery control system including: a secondary battery within which gas is generated with use; and a controller configured to control charging/discharging of the secondary battery. The controller includes: a measurer configured to measure a resistance of the secondary battery; and a stop director configured to stop charging/discharging of the secondary battery when the resistance of the secondary battery has exceeded a predetermined resistance threshold.

A second aspect of the disclosure provides a battery control system including: a secondary battery within which gas is generated with use: and a controller configured to control charging/discharging of the secondary battery. The controller includes: a measurer configured to measure a resistance and a capacity of the secondary battery; and a stop director configured to stop charging/discharging of the secondary battery when the resistance of the secondary battery has exceeded a predetermined resistance threshold or when the capacity of the secondary battery has decreased below a predetermined capacity threshold.

With repeated charging and discharging cycles, an active material included in an electrode may degrade and electrolyte may decompose to generate gas, resulting in an increase in the internal pressure of the battery. Therefore, there is an intimate relationship between the resistance and the internal pressure of the battery (see FIG. 1). In the first and second aspects of the present disclosure, this characteristic of the battery is utilized. That is, the resistance of the battery is measured. When the resistance measurement of the battery has exceeded a predetermined resistance threshold, charging/discharging of the battery is stopped. Since there is an intimate relationship between the resistance and the internal pressure of the battery, an accurate determination as to whether to stop charging/discharging of battery can be made. That is, when the resistance of the battery is above the resistance threshold, it is likely that the internal pressure has reached a specific level. Thus, an accurate determination as to whether to stop charging/discharging of battery can be made.

In the second aspect of the present disclosure, not only a resistance of the secondary battery, but also a capacity of the secondary battery is measured. When the resistance has increased above the resistance threshold or when the capacity has decreased below the capacity threshold, charging/discharging of the battery is stopped. This enables more accurately determining whether to stop charging/discharging of the battery. That is, with repeated charging and discharging cycles, the electrolyte or the like may decompose to generate gas, resulting in an increase in the internal pressure of the battery and a decrease in the capacity of the battery. Therefore, there is an intimate relationship between the capacity and the internal pressure of the battery (see FIG. 13). When the capacity of the battery has decreased below the capacity threshold, the internal pressure is likely to have reached a specific level. Therefore, use of the capacity enables more accurately determining whether to stop charging/discharging of the battery.

In the second aspect, both the resistance and the capacity of the battery are used to determine as whether to stop charging/discharging of the battery. Therefore, as described later, under some circumstances, the resistance may change faster than the capacity. Under some other circumstances, the capacity may change faster. Thus, a determination as to whether to stop charging/discharging can be made using the resistance and the capacity of the battery.

The battery control system configured as above can increase the reliability of a determination as to whether to stop charging/discharging of the battery.

DESCRIPTION OF SPECIFIC EMBODIMENTS

Figure 1:
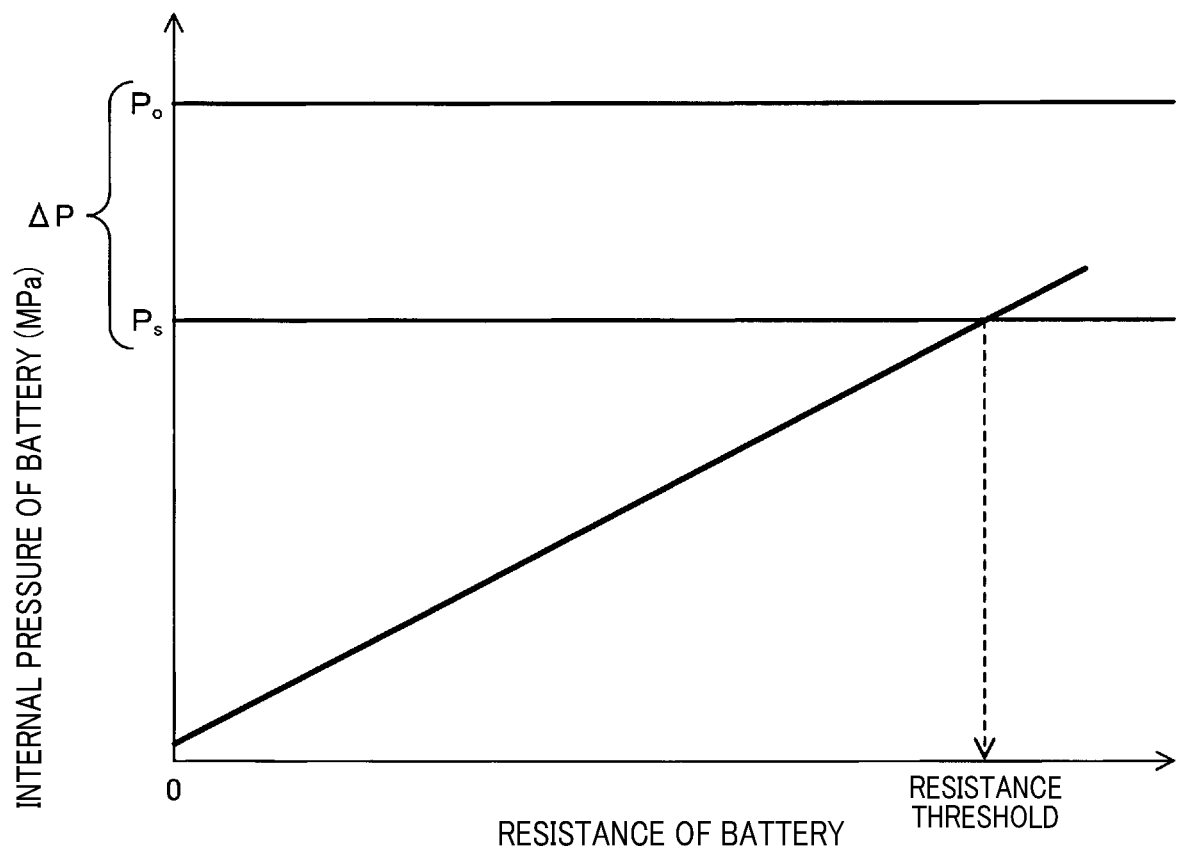
FIG. 1 is a graph illustrating a relationship between resistance and internal pressure of a battery according to a first embodiment of the present disclosure.

With reference to the accompanying drawings, hereinafter are described several embodiments of the present invention. Substantially common elements or steps throughout the embodiments are assigned the same numbers and will not be redundantly described.

First Embodiment

A battery control system in accordance with a first embodiment of the present disclosure will now be described with reference to FIGS. 1 to 5. The battery control system of the first embodiment may be configured to be mounted in an electrical vehicle. As shown in FIG. 2, the battery control system 1 includes a secondary battery 2 and a controller 3. The secondary battery 2 may be a battery, such as a Li-ion battery, a Na-ion battery or the like, within which gas is generated with use. The controller 3 controls charging/discharging of the secondary battery 2.

The controller 3 includes a measurer 31 and a stop director 32. The measurer 31 is configured to measure a resistance of the secondary battery 2 that has degraded with use. The stop director 32 is configured to stop charging/discharging of the secondary battery 2 when the resistance measurement has exceeded a resistance threshold.

As shown in FIG. 2, the battery 2 is electrically connected to the battery charger 4 and the electrical load 5. A charge switch 41 is provided between the battery 2 and the battery charger 4. A load switch 51 is electrically connected between the electrical load 5 and the battery 2. The charge switch 41 and the load switch 51 are on/off controlled by the controller 3. The controller 3 turns on the charge switch 41 to charge the battery 2. The load switch 51 is turned on to drive the electrical load 5.

The battery control system 1 of the present embodiment is an battery control system mounted in a vehicle. The electrical load 5 is a vehicle inverter, which is connected to a three-phase AC motor for driving the vehicle. In the present embodiment, direct-current (DC) power from the battery 2 is converted into alternating-current (AC) power to drive the three-phase AC motor.

Figure 5:
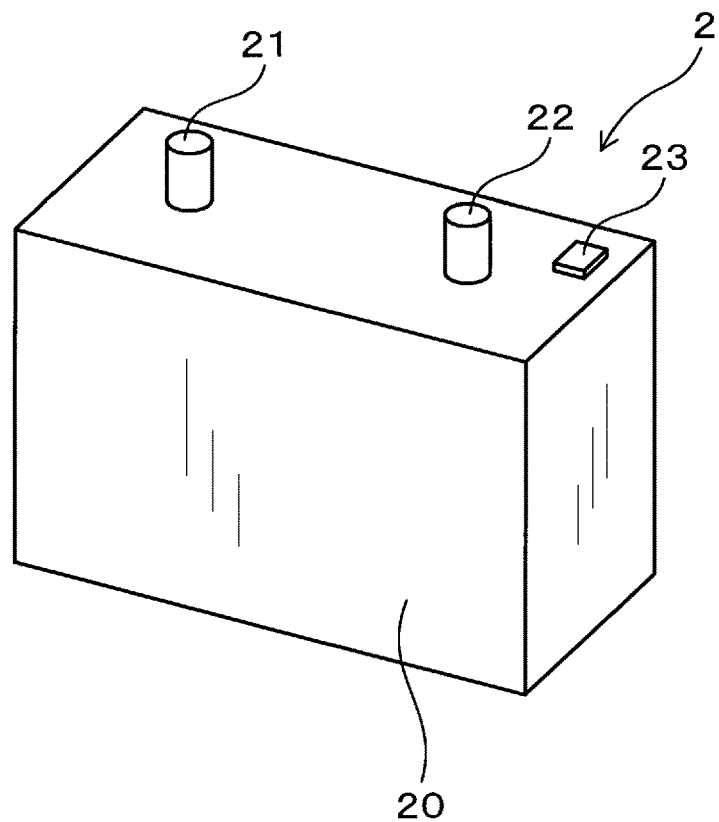
FIG. 5 is a perspective view of the battery according to the first embodiment.

As shown in FIG. 5, the battery 2 includes a casing 20, a pair of electrodes 21, 22, and a valve 23 formed on the casing 20. With repeated charging and discharging cycles over an extended period, electrolyte or the like may decompose to generate gas, which may result in an increase in internal pressure within the casing 20. When the internal pressure has reached an opening pressure $P_O$, the valve 23 will open, which causes the gas to be released. As a result, unusual odor may occur or electrolyte may leak. In the present embodiment, the controller 3 is configured to stop charging/discharging of the battery 2 before the valve 23 is opened.

Figure 2:
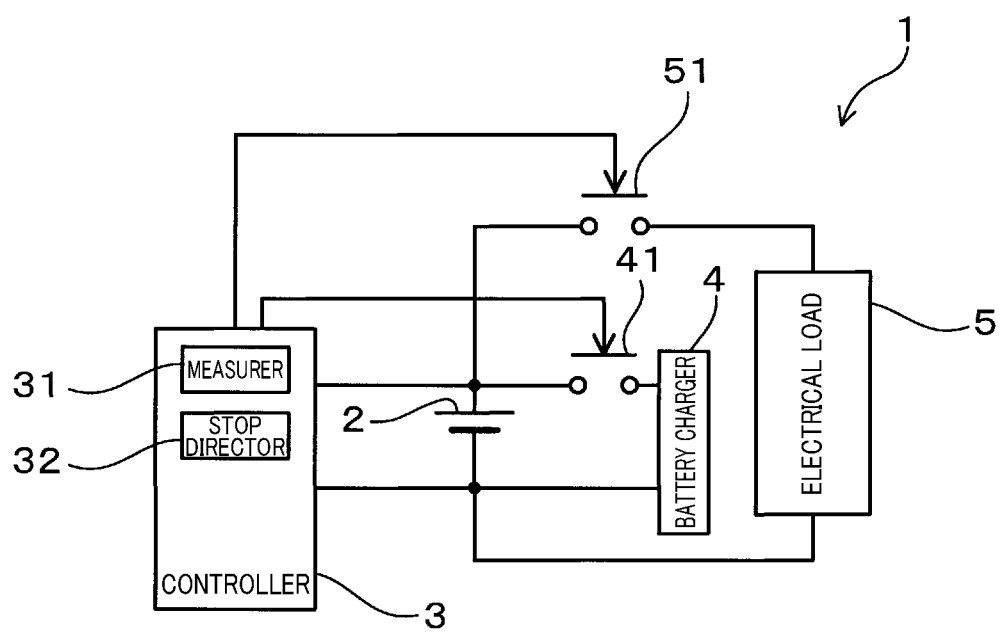
FIG. 2 is a schematic diagram of a battery control system according to the first embodiment.

FIG. 1 illustrates a relationship between the resistance and the internal pressure of the battery 2. With repeated charging and discharging cycles over an extended period of time, an active material forming electrodes may degrade and the resistance may gradually increase. With repeated charging and discharging cycles, the electrolyte or the like may decompose to generate gas, resulting in a rise in the internal pressure of the battery 2. When the internal pressure has reached an opening pressure $P_O$, the valve 23 is opened. A variance $\Delta P$, a stop pressure $P_S$ is set below the opening pressure $P_O$. When the internal pressure reaches the stop pressure $P_S$, charging/discharging of the battery 2 is stopped.

The opening pressure $P_O$ is designed for an employed material, a volume, a use circumstance, and usage of the battery 2. The stop pressure $P_S$ may be set taking into account a setting opening pressure $P_O$ of commercially available batteries and a withstanding pressure design for a battery pack component securing one or more batteries. Conversely, from usage of the battery and an internal pressure increase property, a strength of a casing, the opening pressure PO of the battery may be designed, thereby setting the stop pressure $P_S$.

As shown in FIG. 1, under a certain condition of the temperature and the state of charge of the battery, the internal pressure of the battery 2 is expressed as a linear function of the resistance. A resistance of the battery 2 when the stop pressure $P_S$ is reached can be calculated by preliminarily investigating this linear function. The relationship between the internal pressure and the resistance is not limited to the linear function. The relationship between the internal pressure and the resistance may be calculated using other relational expressions and maps in a similar manner as the resistance. When the resistance measurement has exceeded the resistance threshold, the controller 3 determines that the internal pressure has reached the stop pressure $P_S$ and then stops charging/discharging of the battery 2.

Figure 4:
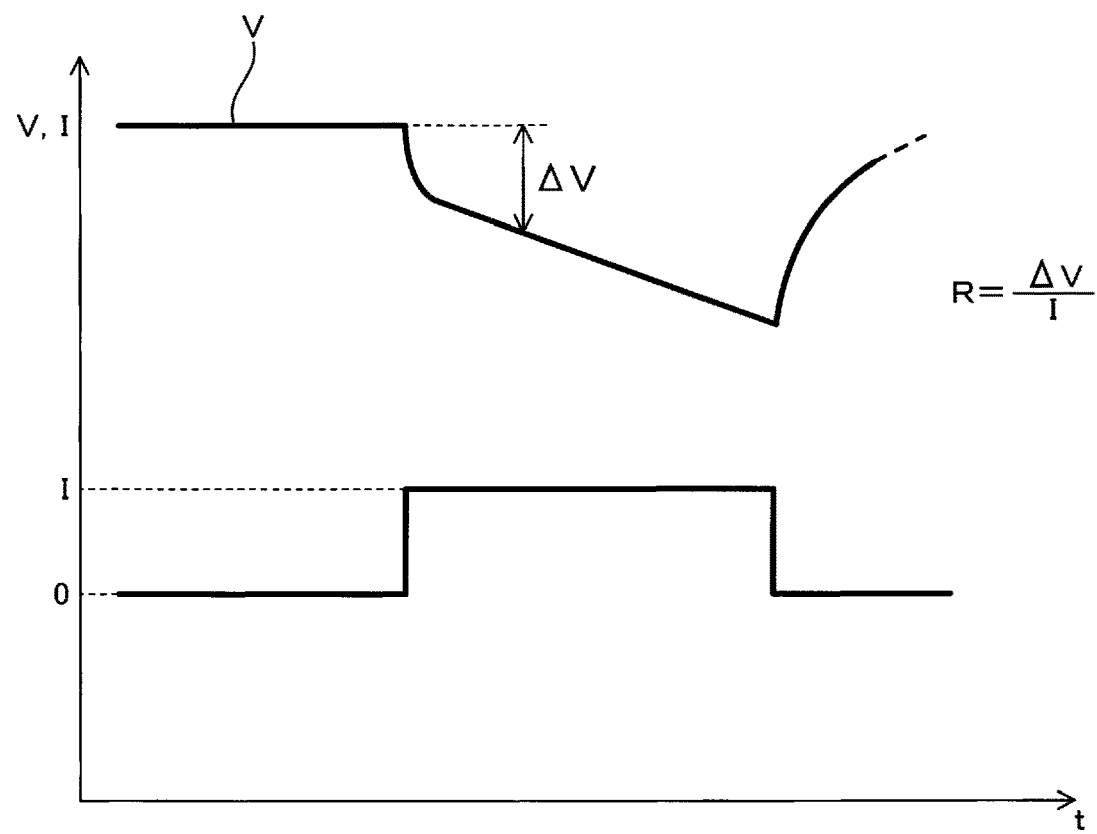
FIG. 4 is an illustration of measuring a resistance of the battery while discharging the battery according to the first embodiment.

A method of measuring the resistance will now be described. As shown in FIG. 4, as the battery 2 is discharged with a constant current I, a voltage V of the battery 2 gradually decreased. Assuming that an amount of change in voltage $\Delta V$ and the current I when a predetermined time has elapsed from the beginning of discharging, the resistance R can be calculated as follows: $R=\Delta V/I$.

The resistance R varies with the temperature and the state of charge of the battery 2. Thus, the resistance is measured after setting each of the temperature and the state of charge to a predetermined value. A relationship between the temperature, the state of charge and the resistance is pre-stored in the controller 3. An accurate resistance is calculated using these relationships.

In the present embodiment, an amount of change in voltage $\Delta V$ is measured during discharge of the battery 2. In an alternative embodiment, the resistance may be measured using an amount of change in voltage $\Delta V$ that occurs during charge of the battery 2.

Figure 3:
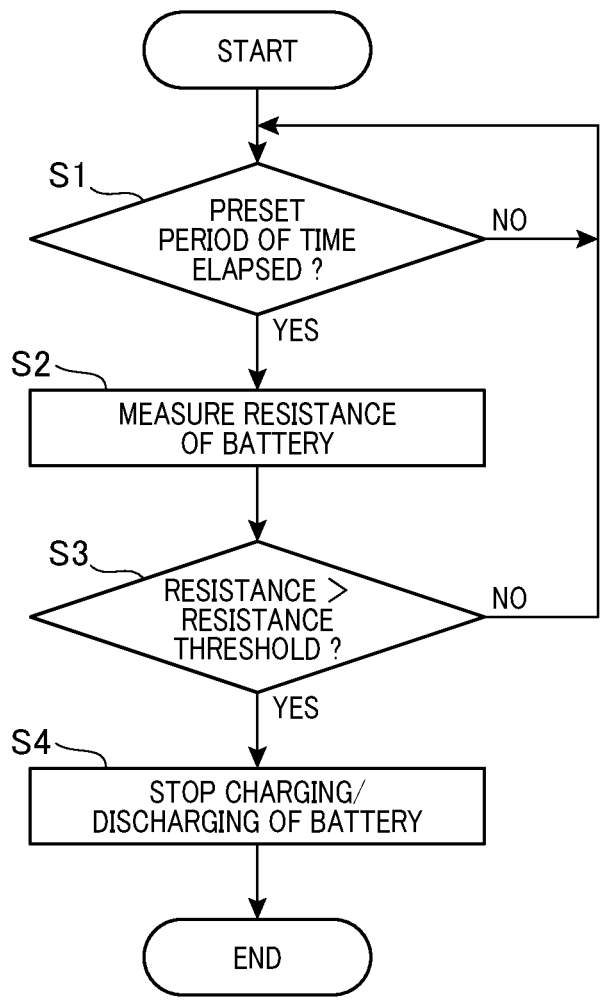
FIG. 3 is a flowchart of processing performed by a controller of the battery control system according to the first embodiment.

A flowchart of processing performed by the controller 3 will now be described. As shown in FIG. 3, the controller 3, at step S1, determines whether or not a preset period of time (for example, a few days) has elapsed. If at step S1 it is determined that the preset period of time has elapsed, then the process flow proceeds to step S2. At step S2, the controller 3 measures a resistance of the battery 2. As described above, the resistance of the battery 2 may be calculated using an amount of change $\Delta V$ in voltage that has occurred during charge or discharge of the battery 2 with a constant current I.

Subsequently to step S2, the process flow proceeds to step S3. At step S3, the controller determines whether or not the resistance of the battery 2 has exceeded a resistance threshold. If it is determined that the resistance of the battery 2 has not exceeded the resistance threshold, then the process flow returns to step S1. If it is determined that the resistance of the battery 2 has exceeded the resistance threshold, then the process flow proceeds to step S4. At step S4, the controller 3 stops charging/discharging of the battery 2 as it is likely that the internal pressure of the battery 2 has reached a stop pressure $P_S$.

The present embodiment can provide the following advantages. As shown in FIG. 1, there is a correlation between the resistance of the battery 2 degraded by repeated charging and discharging cycles and the internal pressure of the battery 2. As the resistance of the battery 2 increases with use, the internal pressure of the battery 2 increases.

In the present disclosure, this characteristic of the battery 2 is utilized. That is, the measurer 31 measures a resistance of the battery 2. When the resistance measurement of the battery 2 has exceeded a predetermined resistance threshold, the stop director 32 stops charging/discharging of the battery 2. When the resistance of the battery 2 is above the resistance threshold, it is likely that the internal pressure has reached the stop pressure $P_S$. Thus, an exact determination as to whether to stop charging/discharging of battery 2 can be made.

In the present embodiment, the latest resistance of the battery 2 is measured, and a determination as to whether to stop charging/discharging of the battery 2 can be made using only the resistance measurement of the battery 2. This configuration can eliminate a need to measure the temperature or the like over a period of time. Thus, a determination as to whether to stop charging/discharging of the battery 2 can be made by the controller 3 having a simple configuration.

An embodiment may be envisaged where the battery 2 is provided with a pressure sensor or the like to measure an internal pressure of the battery 2. In such an embodiment, the size and weight of the battery 2 are likely to increase, which may result in increased manufacturing costs of the battery 2. The configuration of the present embodiment described as above may eliminate a need to provide a pressure sensor to the battery 2, therefore, such a defect is less likely to occur.

In addition, a resistance of the battery 2 can accurately be measured in a relatively short time. A voltage sensor and a current sensor are necessary components to measure the resistance of the battery 2. As these components are inevitably used for charging/discharging the battery 2, a dedicated component does not need to be provided to measure the resistance of the battery 2. Therefore, use of the resistance of the battery 2 allows an exact determination as to whether to stop charging/discharging of the battery 2 to be made in a short time and at low cost.

The battery control system configured as above can increase the reliability of a determination as to whether to stop charging/discharging of the battery.

In the present embodiment, the battery 2 is connected to the vehicle inverter. In an alternative embodiment, the battery 2 may be replaced with an emplaced power source, such as a home energy management system (HEMS) or the like, or a power source of a personal computer, a smart phone or the like.

In the embodiments described below, among the reference numbers used in their drawings, the same reference numbers as those used in the first embodiment denote components or the like that are similar to those of the first embodiment unless otherwise noted.

Second Embodiment

Figure 7:
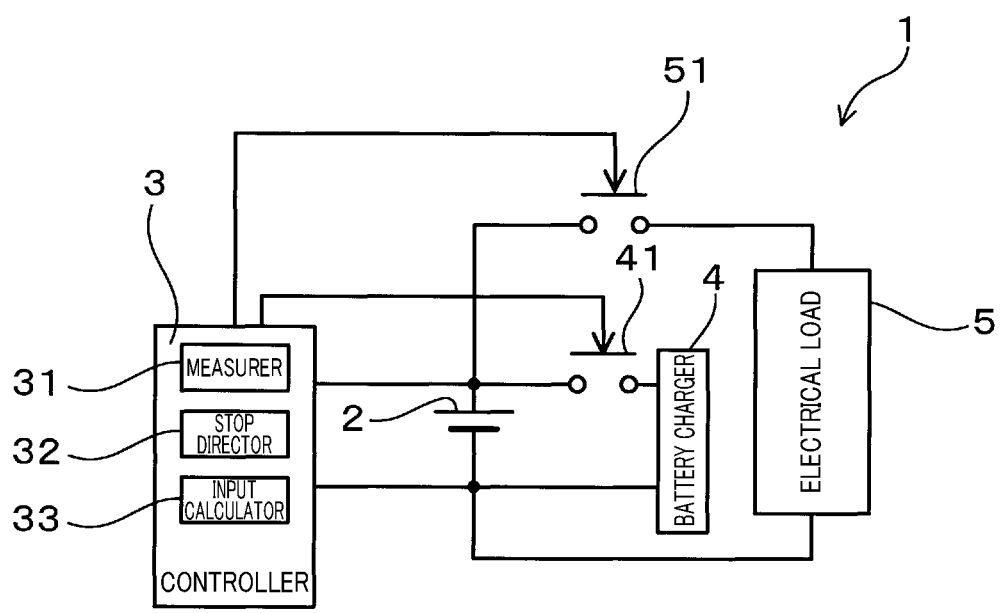
FIG. 7 is a schematic diagram of a battery control system according to the second embodiment.

In a second embodiment, the controller 3 is modified in configuration. As shown in FIG. 7, the controller 3 of the present embodiment includes not only the measurer 31 and the stop director 32, but also an input calculator 33. The input calculator 33 is configured to calculate a resistance threshold using information regarding a temperature and a state of charge (SOC) of the battery 2 under a use circumstance, both of which are externally input. For example, the information regarding a temperature and a state of charge (SOC) of the battery 2 may be information regarding a geographic region where the battery 2 is used and an employed system. Such information is closely tied to the temperature and the SOC of the battery 2.

Figure 6:
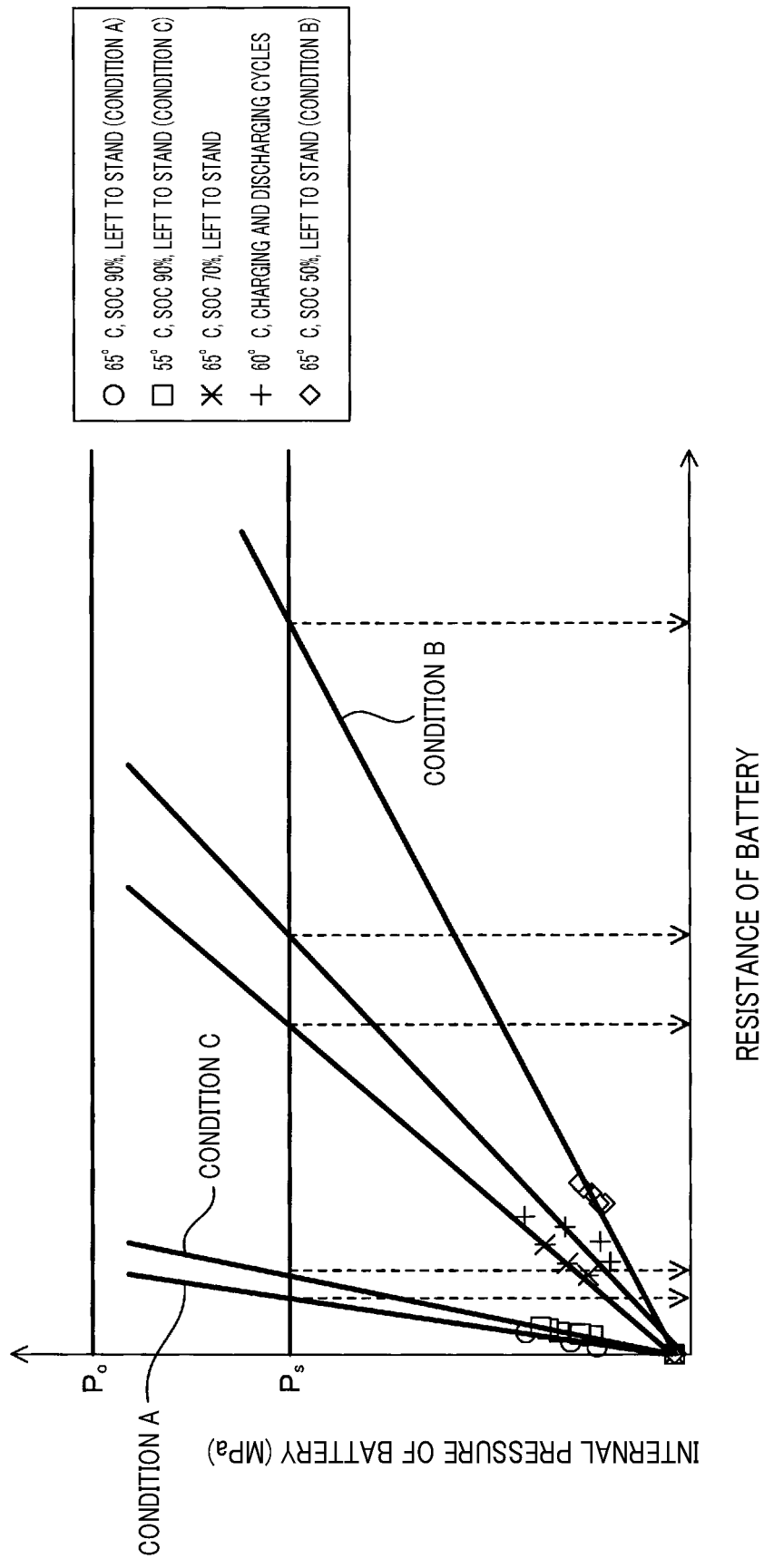
FIG. 6 is a graph illustrating relationships between resistance and internal pressure of the battery according to a second embodiment.

FIG. 6 is a graph illustrating a relationship between the resistance and the internal pressure of each of a plurality of battery 2 used under different use circumstances. In a condition A, the battery 2 has an SOC of 90% and stands at 65° C. In a condition B, the battery 2 has an SOC of 50% and stands at 65° C. It can be found from the graph of FIG. 6 that the resistance of the battery 2 under the condition B when the stop pressure $P_S$ is reached is higher than under the condition A. This may be because a lower state of charge (i.e., a lower voltage) of the battery 2, as under the condition B, can make the electrical resistance of an active material included in an electrode more likely to increase. For example, in the case where a lithium-ion battery is used as the battery 2, $Mn^{2+}$ is dissolved from $LiMn_2O_4$ included in a positive terminal to deposit on the active material of a negative terminal, which results in an increase of the electrical resistance of the battery 2. A lower state of charge of the battery 2 (a lower voltage of the battery 2) can make this reaction more likely to proceed. Thus, the resistance threshold needs to be set higher for use of the battery at a lower state of charge.

Comparing the condition A and a condition C that the battery has the same SCO of 90% and stands at a lower temperature of 55° C., it can be noted that the resistance when the stop pressure $P_S$ is reached under the condition A is lower than that under the condition C. This may be because a higher temperature of the battery 2 can make the electrolyte of the battery 2 more likely to decompose to generate gas. Under a higher temperature use circumstance, the resistance threshold needs to be set lower.

The resistance threshold may be calculated as follows. Relationships between temperatures, states of charge, and slopes and intercepts of linear functions of the battery 2 are preliminarily investigated. When a geographic region of use and a system type are externally input, an average temperature and an average state of charge in this geographic region of use are calculated. Using these values, a slope and an intercept of a linear function are determined. That is, a linear function is determined. Using this linear function, the resistance when the stop pressure $P_S$ is reached is calculated. The calculated resistance is set as a resistance threshold.

The resistance threshold may be calculated in another manner as follows. Relationships between temperatures, states of charge, and resistance thresholds of the battery 2 are preliminarily investigated. These relationships are pre-stored as a map. When a geographic region of use and a system type are externally input, an average temperature in this geographic region of use and an average state of charge are acquired. The resistance threshold is calculated using these calculated values and the map.

Figure 8:
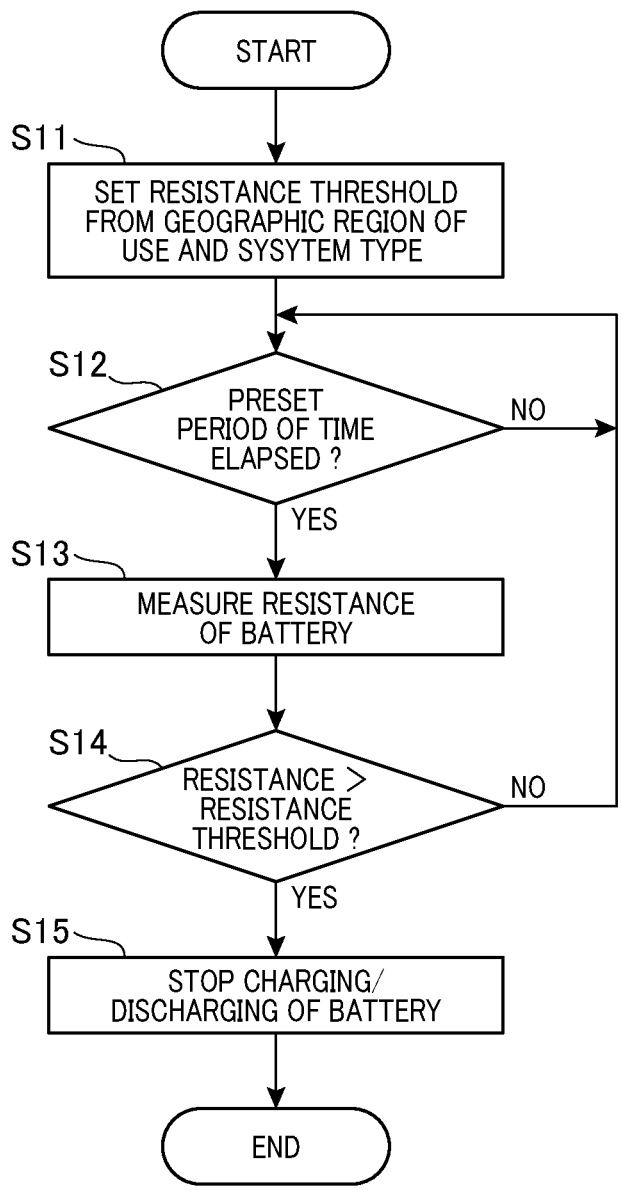
FIG. 8 is a flowchart of processing performed by a controller of the battery control system according to the second embodiment.

A flowchart of processing performed by the controller 3 will now be described. As shown in FIG. 8, upon initiating use of the battery 2, the controller 3, at step S11, calculates a resistance threshold using a geographic region of use and a system type of the battery 2 (e.g., information regarding an operating temperature, a state of charge, and the like) inputted by the a provider or a user of the battery control system 1.

Subsequently, the process flow proceeds to step S12. At step S12, the controller determines whether or not a preset period of time has elapsed. If at step S12 it is determined that the preset period of time has elapsed, then the process flow proceeds to step S13. At step S13, the controller 3 measures a resistance of the battery 2. Thereafter, the process flow proceeds to step S14. At step S14, the controller 3 determines whether or not the resistance of the battery 2 has exceeded a resistance threshold. If it is determined that the resistance of the battery 2 has not yet exceeded the resistance threshold, then the process flow returns to step S12. If it is determined that the resistance of the battery 2 has exceeded the resistance threshold, then the process flow proceeds to step S15. At step S15, the controller 3 stops charging/discharging of the battery 2, as it is likely that the internal pressure of the battery 2 has reached a stop pressure $P_S$.

The present embodiment can provide not only the advantages of the first embodiment, but also the following advantage. In the present embodiment, the controller 3 includes the input calculator 33. Therefore, an optimal resistance threshold can be set in response to the operating temperature and state of charge of the battery 2. This configuration enables more accurately determining whether to stop charging/discharging of the battery 2.

Third Embodiment

Figure 9:
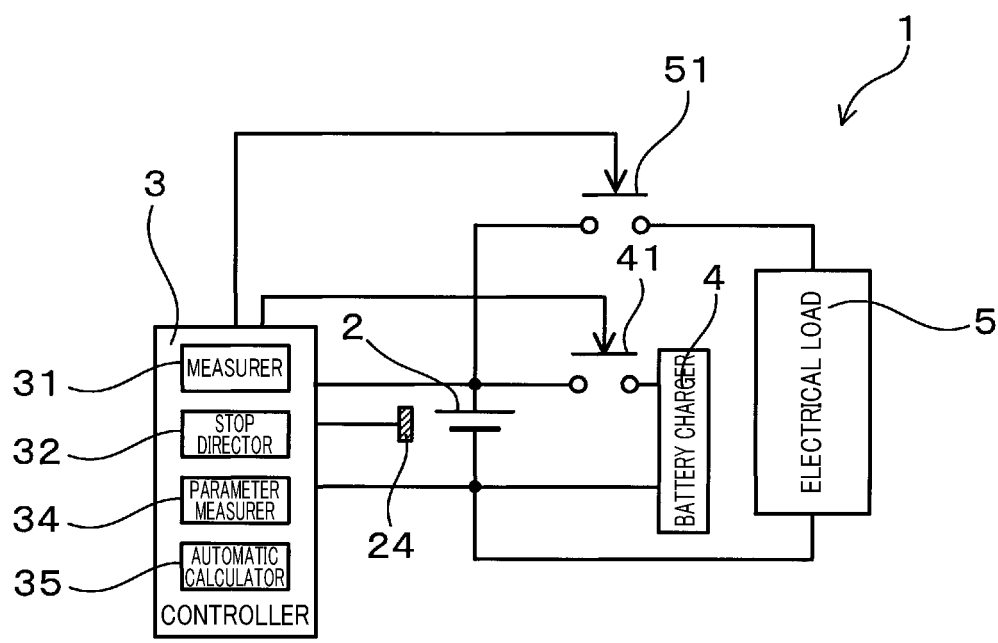
FIG. 9 is a schematic diagram of a battery control system according to a third embodiment.

In a third embodiment, the controller 3 is modified in configuration as compared to the first embodiment. As shown in FIG. 9, the controller 3 of the present embodiment includes not only the measurer 31 and the stop director 32, but also a parameter measurer 34 and an automatic calculator 35. The parameter measurer 34 is configured to measure parameters, such as a temperature, a state of charge and the like, of the battery 2 under a use circumstance. The automatic calculator 35 is configured to, using the measured parameters, calculate a resistance threshold.

As described above, with the internal pressure fixed, the resistance is likely to increase with decreasing state of charge of the battery 2 (see FIG. 6). In addition, with the internal pressure fixed, the resistance is likely to decrease with increasing temperature of the battery 2 (see FIG. 6). Thus, preferably, the resistance threshold is changed in response to the state of charge and the temperature in the use circumstance. In the present embodiment, information regarding an operating temperature and a state of charge of the battery 2 is not externally input, but acquired by the controller 3. A resistance of the battery 2 when the stop pressure $P_S$ is reached, that is, a resistance threshold, is calculated using the acquired information.

The resistance threshold may be calculated as follows. Relationships between operating temperatures, states of charge, and slopes and intercepts of linear functions of the battery 2 are preliminarily investigated. After initiation of use of the batter 2, an operating temperature and a state of charge of the battery 2 are regularly measured. Using these values, a slope and an intercept of a linear function are determined. That is, a linear function is determined. Using this linear function, the resistance of the battery 2 when the stop pressure $P_S$ is reached is calculated. The calculated resistance is set as a resistance threshold.

Figure 12:
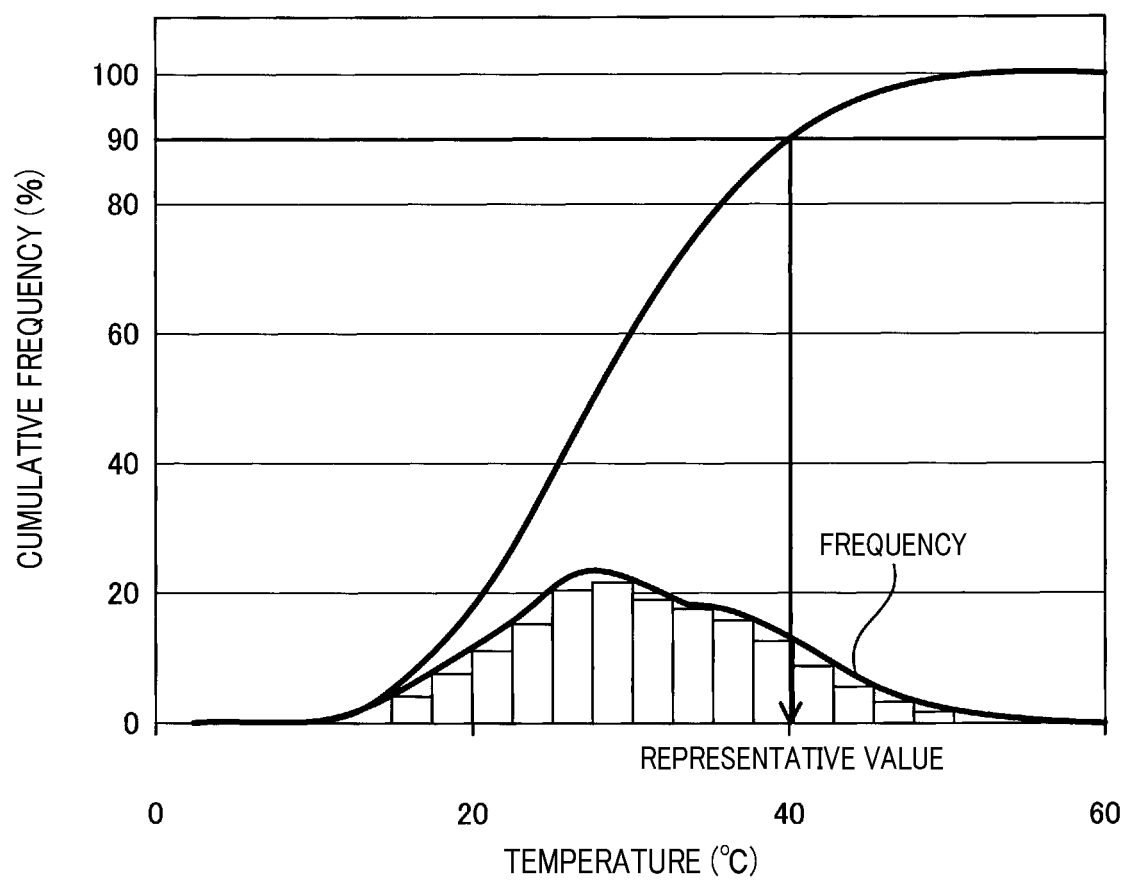
FIG. 12 is an illustration of calculating a representative value of temperature of the battery according to the third embodiment.

A method of calculating a resistance threshold will now be described in more detail. In the present embodiment, as show in FIG. 9, a temperature sensor 24 is attached to the battery 2. A temperature of the battery 2 is regularly measured using this temperature sensor 24. For example, this temperature measurement may be performed every thirty minutes. As shown in FIG. 12, a frequency distribution of temperature and cumulative frequencies of temperature are acquired. For example, a temperature whose cumulative frequency reaches 90% is a representative value. That is, temperatures lower than the representative value account for 90%.

Figure 13:
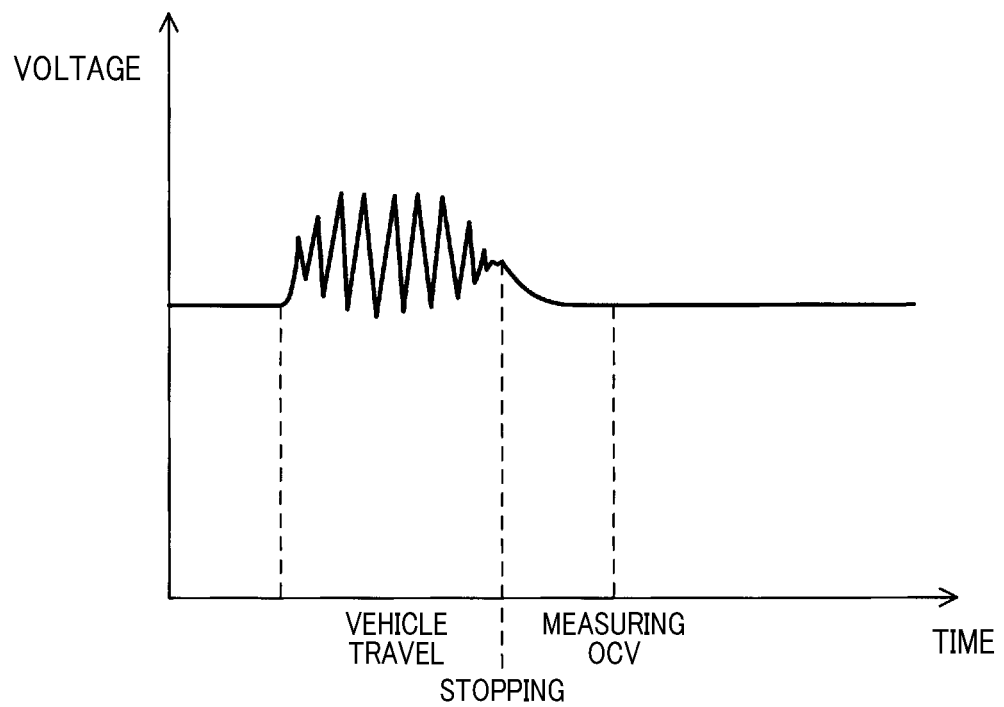
FIG. 13 is a graph illustrating when to measure a state of charge of the battery according to the third embodiment.

A state of charge of the battery 2 can be calculated by measuring an open circuit voltage (OCV) of the battery 2. The OCV of the battery 2 can not be accurately measured immediately after the battery 2 has been charge or discharged. Thus, the OCV of the battery 2 is measured after a period of time has elapsed from when charging/discharging of the battery 2 was stopped. For example, in the case where the battery 2 is used for the vehicle inverter or the like, the battery is discharged or charged during travel of the vehicle as shown in FIG. 13. Thus, a voltage of the battery 2 is unstable during travel of the vehicle. After a few hours have elapsed from when charging/discharging of the battery 2 was stopped, the voltage of the battery 2 settle and the OCV becomes measurable. For example, the OCV may be measured once a day. The state of charge can be calculated using the OCV measurement. This state of charge may be measured for one year. A state of charge whose cumulative frequency reaches 90% can be calculated as its representative value in a similar manner as the representative value of temperature. The linear function is determined using the representative value of temperature and the representative value of SOC, thereby calculating a resistance threshold.

Figure 10:
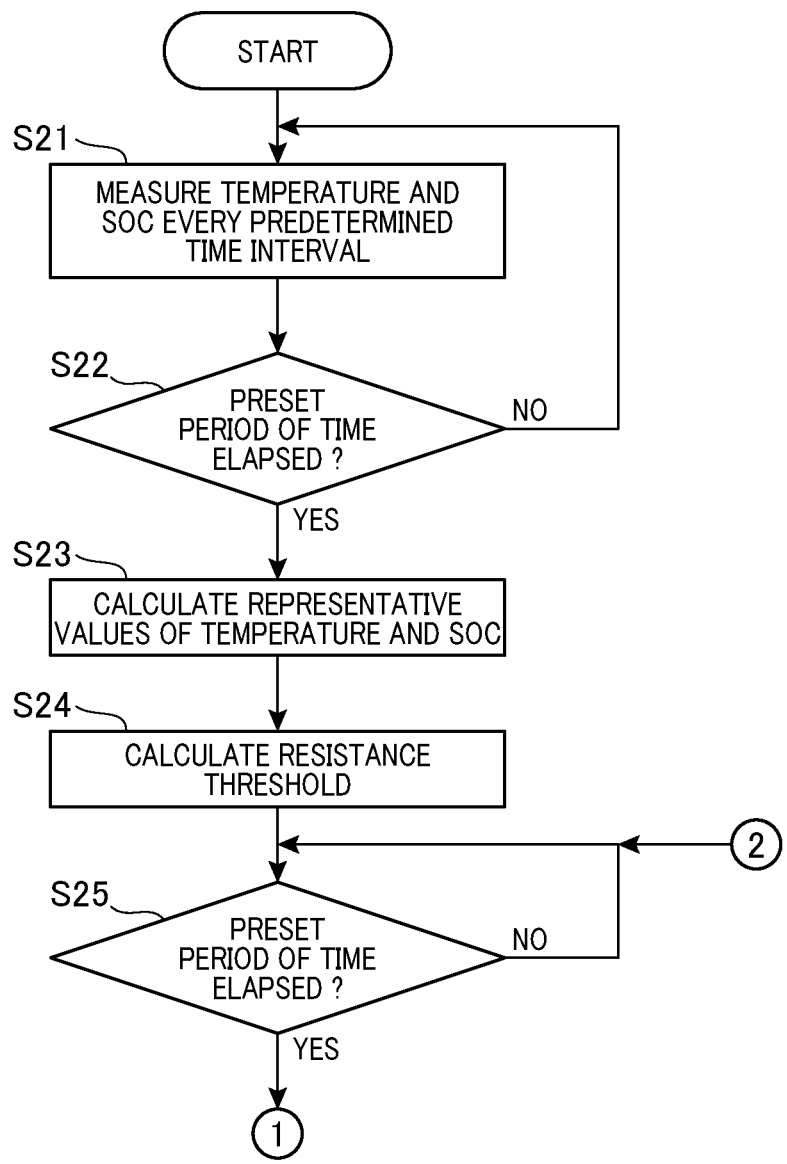
FIG. 10 is a flowchart of processing performed by a controller of the battery control system according to the third embodiment.
Figure 11:
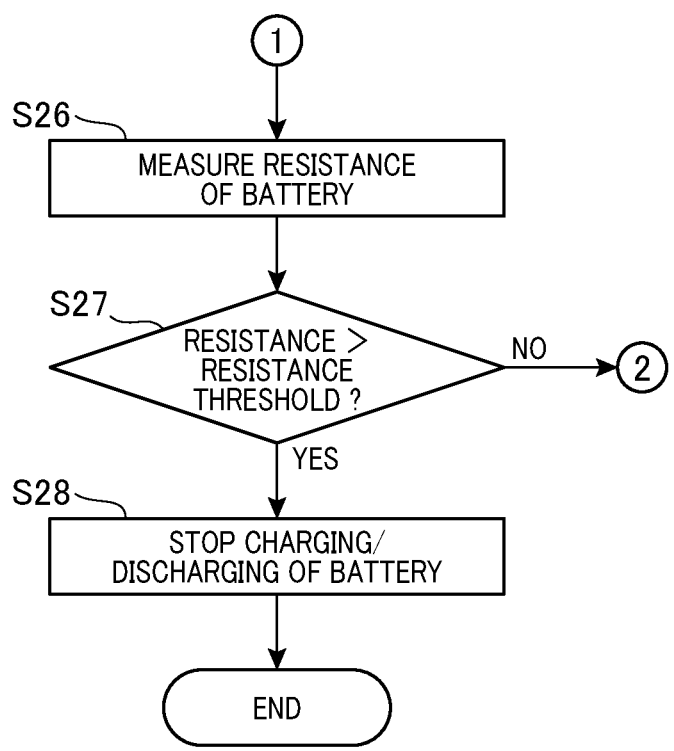
FIG. 11 is a continuation of the flowchart of FIG. 10.

A flowchart of processing performed by the controller 3 will now be described. As shown in FIG. 10, the controller 3, at step S21, measures a temperature and a state of charge (SOC) of the battery 2 every predetermined time interval. For example, the controller 3 may measure a temperature of the battery 2 every thirty minutes and a state of charge (SOC) of the battery 2 once a day.

Subsequently, the process flow proceeds to step S22. At step S22, the controller determines whether or not a preset period of time has elapsed. For example, the controller determines whether or not for the controller has measured a temperature and a state of charge of the battery 2 for one year or more. If at step S22 it is determined that the preset period of time has not yet elapsed, then the process flow returns to step S21. If at step S22 it is determined that the preset period of time has elapsed, then the process flow returns to step S23.

At step S23, the controller 3 calculates a representative value of each of the temperature and the state of charge of the battery 2. In the present embodiment, for each of the temperature and the state of charge of the battery 2, the representative value may be a value that accounts for 90% of a set of measurements (see FIG. 12).

Subsequently, the process flow proceeds to step S24. At step S24, the controller 3 calculates a resistance threshold of the battery 2. More specifically, the controller 3 determines a linear function described above (see FIG. 6) using the representative values of the temperature and the state of charge of the battery 2, and based on the linear function, calculates a resistance of the battery 2 when the stop pressure $P_S$ is reached, that is, a resistance threshold.

Subsequently, the process flow proceeds to step S25. At step S25, the controller 3 determines whether or not the battery 2 has been used for a preset period of time. If at step S25 it is determined that the battery 2 has been used for the preset period of time, then the process flow proceeds to step S26. At step S26, the controller 3 measures a resistance of the battery 2.

Thereafter, the process flow proceeds to step S27. At step S27, the controller 3 determines whether or not the resistance of the battery 2 has exceeded the resistance threshold. If it is determined that the resistance of the battery 2 has not yet exceeded the resistance threshold, then the process flow returns to step S25. If it is determined that the resistance of the battery 2 has exceeded the resistance threshold, then the process flow proceeds to step S28. At step S28, the controller 3 stops charging/discharging of the battery 2, as it is likely that the internal pressure of the battery 2 has reached a stop pressure $P_S$.

In addition to the advantages of the second embodiment, the present embodiment can provide the following advantages. In the present embodiment, the controller 3 includes the parameter measurer 34 and the automatic calculator 35.

With this configuration, parameters, such as a temperature, a state of charge and the like, of the battery 2 under a use circumstance can be calculated by the parameter measurer 34. Therefore, an actual usage state of the battery 2 can be reflected to calculation of the resistance threshold. This enables more accurately calculating a resistance threshold, thereby enabling more accurately determining whether to stop charging/discharging of the battery 2.

The parameter measurer 34 is configured to regularly measure a temperature and a state of charge of the battery 2 as the parameters. The automatic calculator 35 acquires a representative value of temperature from a plurality of temperature measurements and a representative value of state of charge from a plurality of SOC measurements, and using these representative values, calculate a resistance threshold.

This configuration enables more accurately calculating a resistance threshold. That is, as the temperature and the state of charge are correlated with the resistance threshold (see FIG. 6), measuring a temperature and a state of charge enables more accurately calculating a resistance threshold. In the present embodiment, the temperature and the state of charge are measured plural times. The resistance threshold is calculated from a plurality of temperature measurements and a plurality of SOC measurements. This results in increased reliability of the resistance threshold.

Preferably, the representative value of temperature is a value that accounts for 90% of a set of temperature measurements, and the representative value of state of charge is a value that accounts for 90% of a set of SOC measurements.

With this configuration, the representative value of temperature and the representative value of state of charge can be increased, which may result in a decrease in the calculated resistance threshold, enabling earlier stopping of charging/discharging of the battery 2. The internal pressure of the battery 2 becomes less likely to reach the stop pressure $P_S$, which reduce the chances of the valve 23 opening.

In the present embodiment, a temperature and a state of charge are regularly measured for at least one year. Their representative values are calculated using the acquired measurements.

With this configuration, a large number of measurements can be acquired. Therefore, the reliability of the representative values can be increased, which can increase the reliability of the resistance threshold.

In the present embodiment, a temperature and a state of charge of the battery 2 are measured using the parameter measurer 34. Even in the event where such measurement data has been erased due to failures, such an event does not pose a significant issue. That is, in such an event, a temperature and a state of charge may be measured again to determine a linear function, which enables calculating a resistance threshold.

In the present embodiment, the representative value of temperature is a value that accounts for 90% of a set of temperature measurements, and the representative value of state of charge is a value that accounts for 90% of a set of SOC measurements. In an alternative embodiment, the representative value of temperature may be a value that accounts for 50%, 80%, or 100% of a set of temperature measurements, and the representative value of state of charge is a value that accounts for 50%, 80%, or 100% of a set of SOC measurements.

Figure 14:
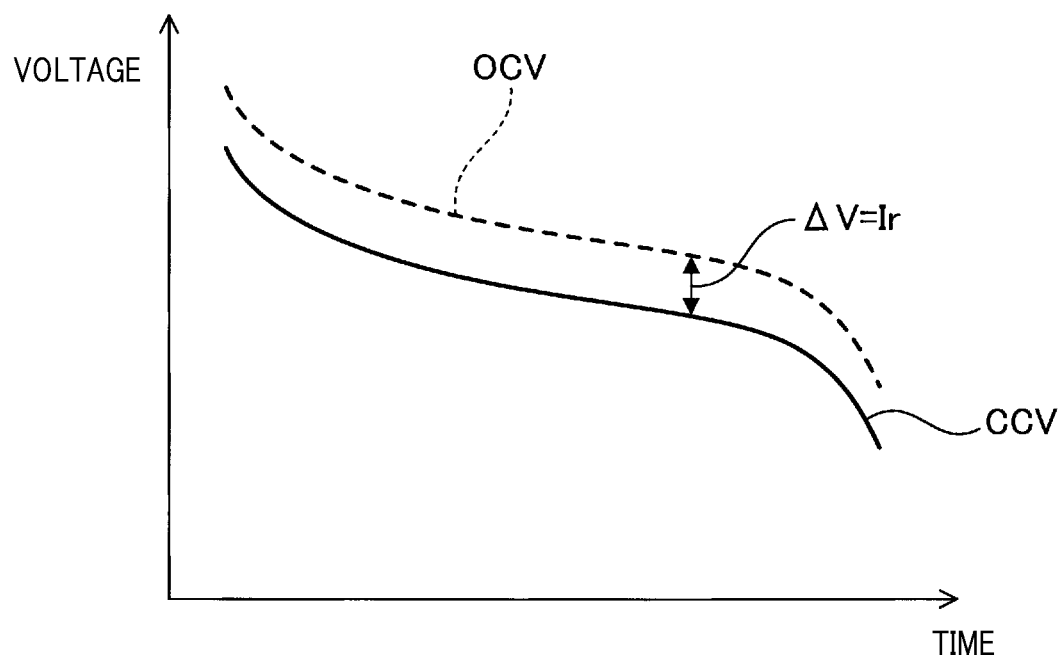
FIG. 14 is an illustration of calculating a state of charge of the battery using a voltage of the battery during discharge according to the third embodiment.

In the present embodiment, as shown in FIG. 13, an OCV is measured after a predetermined period of time has elapsed from when charging/discharging of the battery 2 was stopped. A state of charge (SOC) is calculated using the OCV measurements. In an alternative embodiment, as shown in FIG. 14, a closed circuit voltage (CCV) is measured during discharge of the battery 2. There is a relationship between a CCV measurement, a discharging current I, an internal resistance r of the battery 2, which is expressed as: OCV=CCV+I·r.

The OCV is calculated using this relational expression. A state of charge is calculated using the calculated value of OCV. The state of charge can be calculated during actual use of the battery 2. The number of times the state of charge is measured may be increased. The increased number of times the state of charge is measured can increase the reliability of the representative value of state of charge.

Fourth Embodiment

A fourth embodiment will now be described. The fourth embodiment is different from the first embodiment in that the method of determining whether to stop charging/discharging of the battery is modified. The battery control system 1 of the present embodiment includes, as in the first embodiment, a secondary battery 2 and a controller 3 (see FIG. 2). The controller 3 includes a measurer 31 and a stop director 32. The measurer 31 is configured to measure a resistance and a capacity of the secondary battery 2 that has degraded with use. The stop director 32 is configured to stop charging/discharging of the secondary battery 2 when the resistance measurement has increased above a predetermined resistance threshold or when the capacity measurement has decreased below a predetermined capacity threshold.

Figure 15:
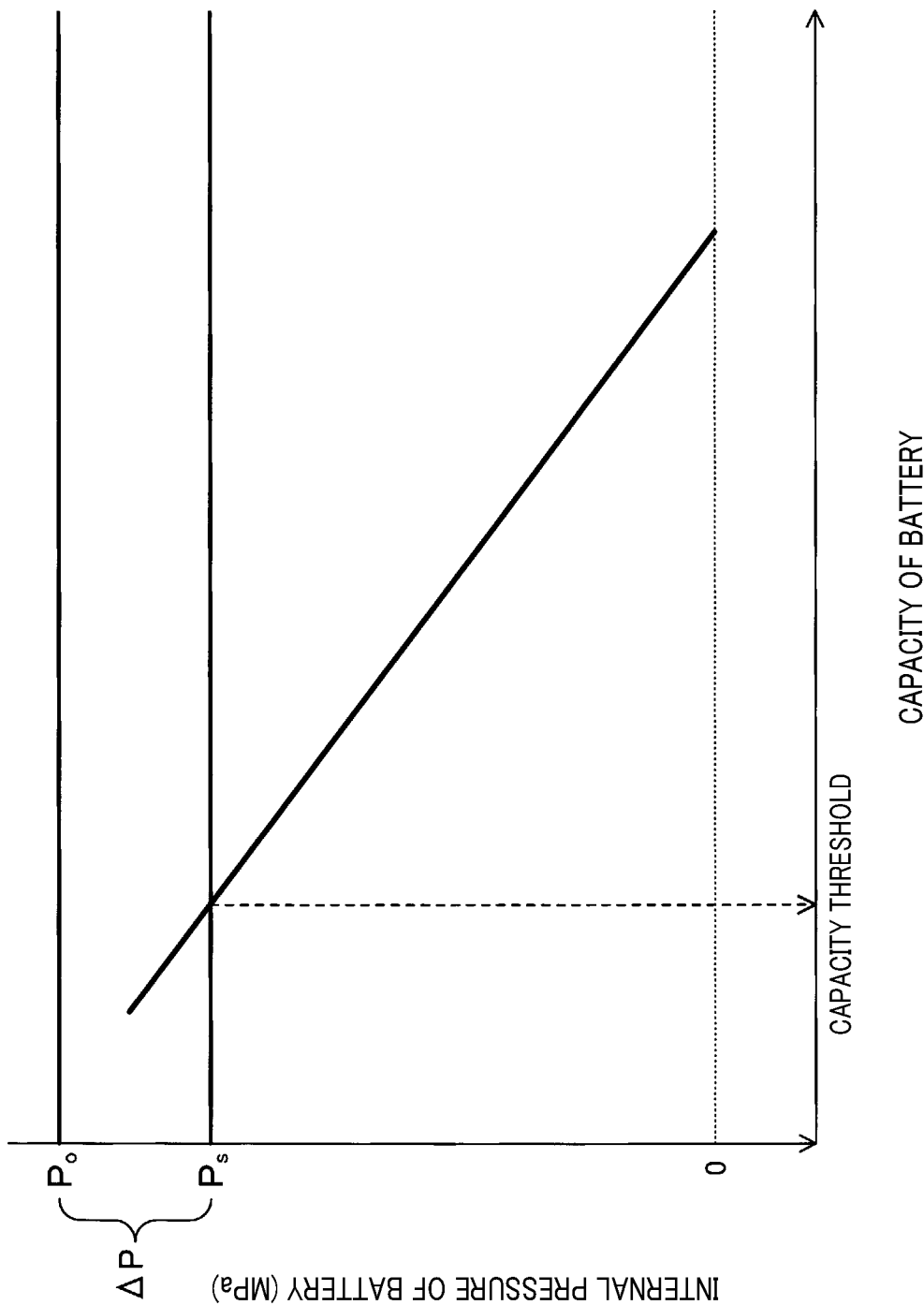
FIG. 15 is a graph illustrating a relationship between capacity and internal pressure of the battery according to a fourth embodiment.

FIG. 15 illustrates a relationship between the resistance and the capacity of the battery 2. With repeated charging and discharging cycles over an extended period of time, electrolyte or the like within the battery 2 may decompose, which may cause the capacity of the battery 2 to gradually decrease. In the present embodiment, as in the first embodiment, the controller 3 is configured to stop charging/discharging of the battery 2 when an opening pressure PO is reached.

As shown in FIG. 1, the internal pressure of the battery 2 is expressed as a linear function of capacity. Therefore, a capacity of the battery 2 when the stop pressure $P_S$ is reached can be calculated by preliminarily investigating this linear function. The relationship between the internal pressure and the capacity is not limited to the linear function. The relationship between the internal pressure and the capacity may be calculated using other relational expressions or maps in a similar manner. In the controller 3, the calculated capacity is set as the capacity threshold.

The controller 3 of the present embodiment, as in the first embodiment, measures a resistance of the battery 2. The controller 3 is configured to, when the resistance measurement has increased above the resistance threshold or when the capacity has decreased below the capacity threshold, determine that the internal pressure has reached the stop pressure $P_S$ and then stops charging/discharging of the battery 2.

Figure 17:
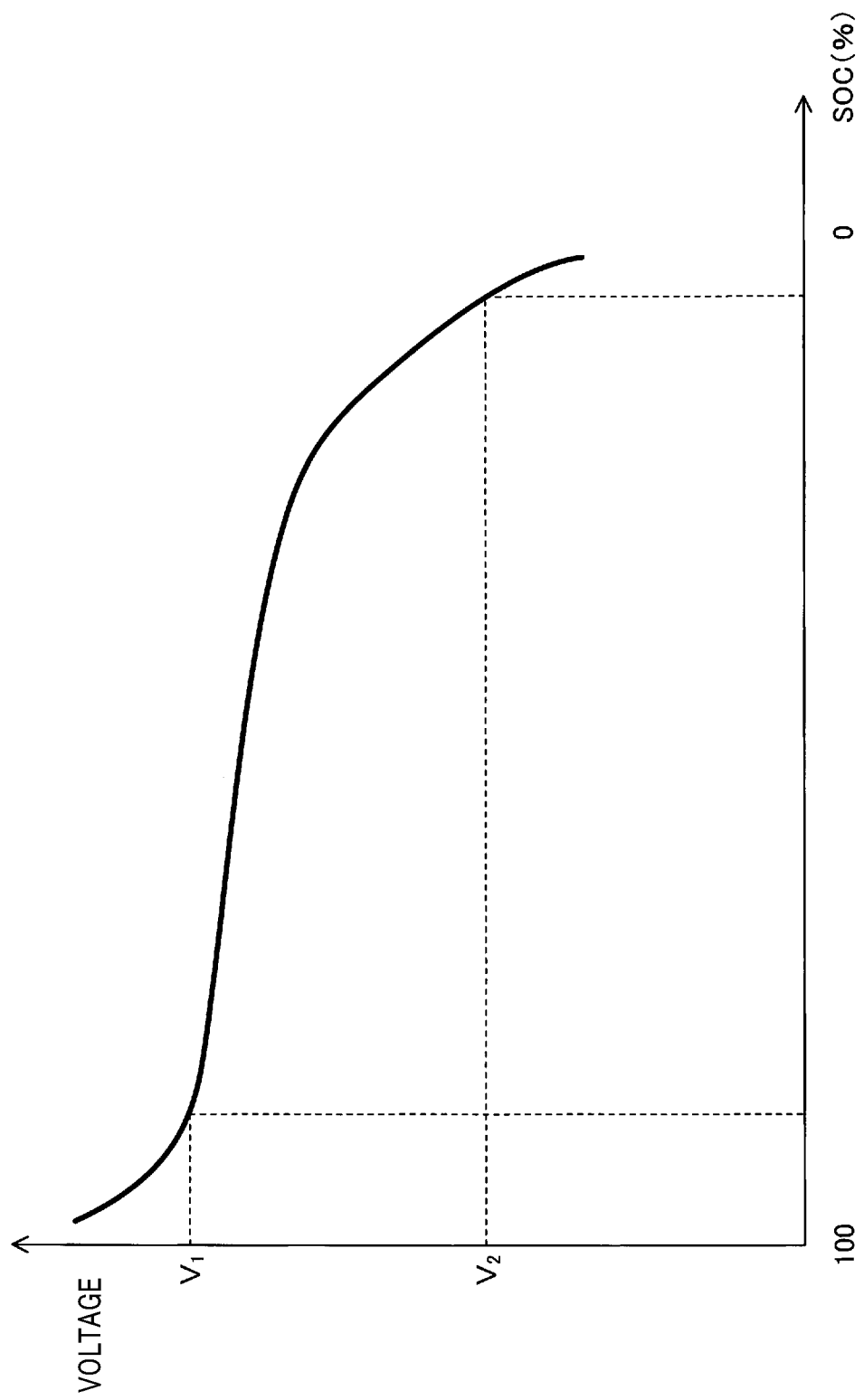
FIG. 17 is an illustration of measuring a capacity of the battery according to the fourth embodiment.

A method of measuring the capacity will now be described. As shown in FIG. 17, as the battery 2 is discharged with a constant current I, a voltage V of the battery 2 gradually decreases. The capacity of the battery 2 can be calculated as follows. A time for the voltage of the battery 2 to fall from V1 to V2 is measured. The measured time multiplied by the constant current I (A) yields the entire capacity (Ah) of the battery 2. Similarly, as the battery 2 is charged with a constant current I, a voltage V of the battery 2 gradually increases. A time for the voltage of the battery 2 to rise from V2 to V1 is measured. The measured time multiplied by the constant current I (A) also yields the total capacity (Ah) of the battery 2.

Figure 18:
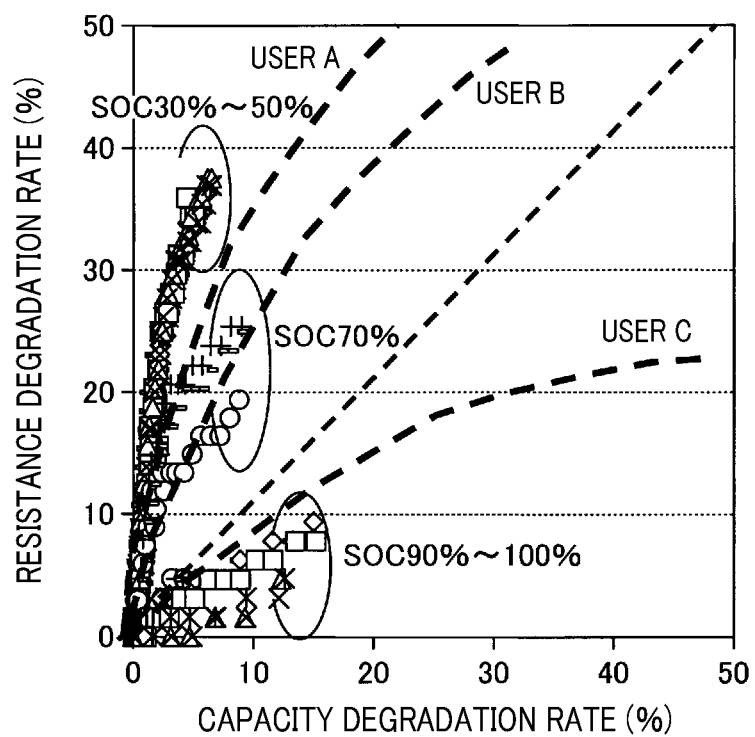
FIG. 18 is a graph plotting relationships between capacity degradation rate and resistance degradation rate for different states of charge of the battery according to the fourth embodiment.

FIG. 18 is a graph illustrating relationships between capacity degradation rate and resistance degradation rate as the state of charge is varied as a parameter during storage of the battery 2. The capacity degradation rate is calculated using the following relational expression: Capacity Degradation Rate=((C0−C1)/C0)×100, where C0 represents a capacity of a unused battery 2 and C1 represents a capacity of a degraded battery 2. Similarly, the resistance degradation rate is calculated using the following relational expression: Resistance Degradation Rate=((R1−R0)/R0)×100, where R0 represents a resistance of an unused battery 2 and R1 represents a capacity of a degraded battery 2.

The graph of FIG. 18 illustrates plotted relationships between the capacity degradation rate and the resistance degradation rate for different states of charge, more specifically, for a SOC range of 90 to 100%, a SOC of 70%, and a SOC range of 30 to 50%.

As can be seen from FIG. 18, in the high SOC range of 90 to 100% of the battery 2, the capacity tends to degrade faster than the resistance. The reason may be considered as follows. In such a high SOC range, the voltage of the battery 2 is high, where the electrolyte of the battery 2 is likely to decompose or a crystal structure of the electrodes is likely to change, which may lead to a decrease in the capacity of the battery 2. In the low SOC range of 30 to 50% of the battery 2, the resistance tends to degrade faster than the capacity. In such a low SOC range, a metallic element, such as Mn or the like, is dissolved from an active material of the electrode. Thus, the resistance of the active material is likely to increase.

As above, under some use circumstances of the battery 2, the capacity degrades faster than the resistance. Under some other use circumstances of the battery 2, the resistance degrades faster than the capacity. In the present embodiment, a determination as to whether to stop charging/discharging is made using both the capacity and the resistance. Therefore, whichever degrades faster, an accurate determination as to whether to stop charging/discharging can be made.

Figure 16:
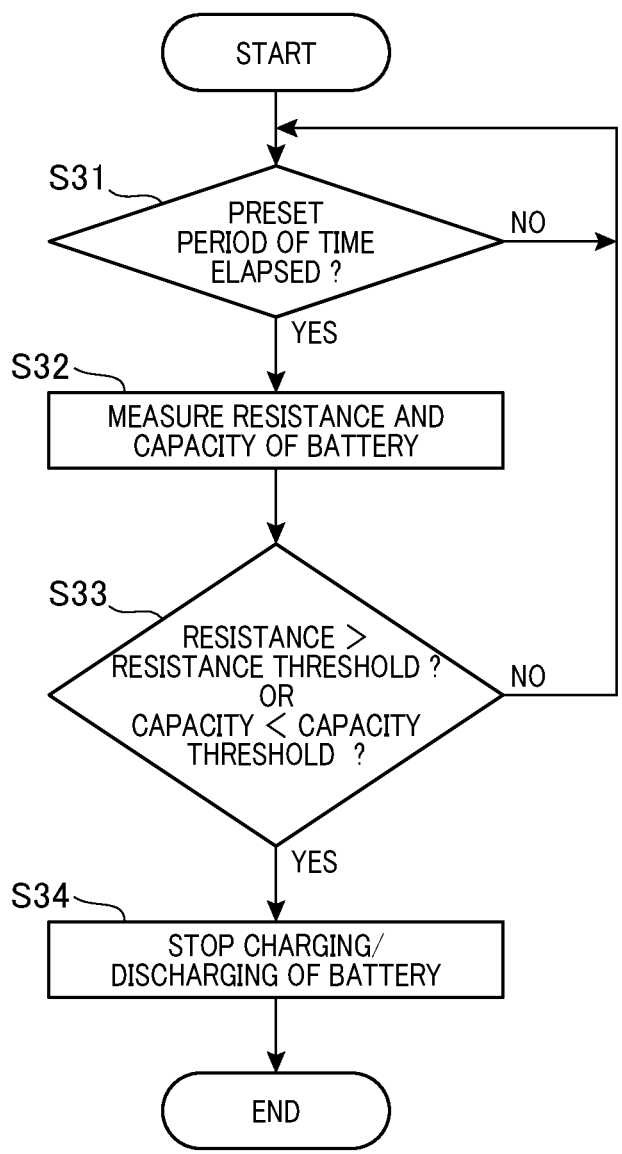
FIG. 16 is a flowchart of processing performed by a controller of the battery control system according to the fourth embodiment.

A flowchart of processing performed by the controller 3 will now be described. As shown in FIG. 16, the controller 3, at step S31, determines whether or not a preset period of time (for example, a few days) has elapsed. If at step S31 it is determined that the preset period of time has elapsed, then the process flow proceeds to step S32. At step S32, the controller 3 measures a resistance and a capacity of the battery 2. The resistance of the battery 2, as described above, may be calculated using an amount of change $\Delta V$ in voltage that has occurred during charge or discharge of the battery 2 with a constant current I. The capacity of the battery 2, as described above, may be calculated using a time period taken for the battery 2 to be charged or discharged with a current I.

Subsequently to step S32, the process flow proceeds to step S33. At step S33, the controller determines whether the resistance of the battery 2 has increased above a resistance threshold or the capacity of the battery 2 has decreased below a capacity threshold. If it is determined that the resistance of the battery 2 has not increased above the resistance threshold and the capacity of the battery 2 has not decreased below the capacity threshold, then the process flow returns to step S31. If it is determined that the resistance of the battery 2 has increased above the resistance threshold or the capacity of the battery 2 has decreased below the capacity threshold, then the process flow proceeds to step S34. At step S34, the controller 3 stops charging/discharging of the battery 2 as it is likely that the internal pressure of the battery 2 has reached a stop pressure $P_S$.

The present embodiment can provide not only the advantages of the first embodiment, but also the following advantage. In the present embodiment, when a resistance of the battery 2 has increased above a resistance threshold or when a capacity of the battery 2 has decreased below a capacity threshold, charging/discharging of the battery 2 is stopped. This enables more accurately determining whether to stop charging/discharging of the battery 2. That is, with repeated charging and discharging cycles, the electrolyte or the like may decompose to generate gas, resulting in an increase in the internal pressure of the battery 2 and a decrease in the capacity of the battery 2. Therefore, there is an intimate relationship between the capacity and the internal pressure of the battery 2 (see FIG. 15). When the capacity of the battery 2 has decreased below the capacity threshold, the internal pressure is likely to have reached a specific level. Therefore, use of the capacity enables more accurately determining whether to stop charging/discharging of the battery 2.

In the present embodiment, both the resistance and the capacity are used to determine whether to stop charging/discharging of the battery 2. Therefore, either when the resistance changes faster or when the capacity changes faster (see FIG. 18), a determination as to whether to stop charging/discharging can be made. Therefore, a more reliable determination as to whether to stop charging/discharging can be made.

Fifth Embodiment

A fifth embodiment will now be described. The fifth embodiment is different from the second embodiment in that the method of determining whether to stop charging/discharging of the battery is modified. The battery control system 1 of the present embodiment includes, as in the second embodiment, a measurer 31, a stop director 32, and an input calculator 33 (see FIG. 7). The input calculator 33 is configured to calculate a resistance threshold and a capacity threshold using externally input information regarding a temperature and a state of charge of the battery 2.

Figure 19:
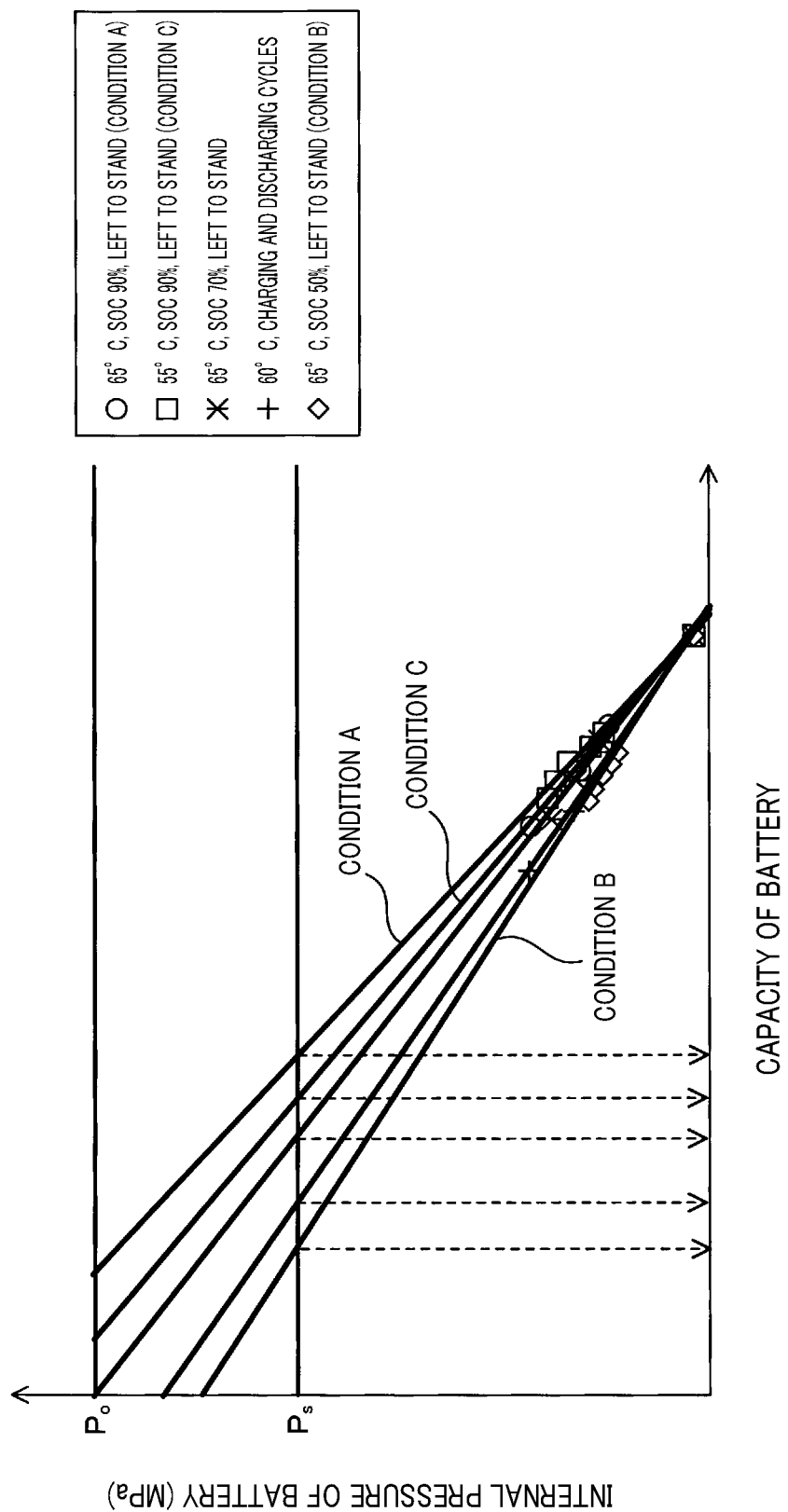
FIG. 19 is a graph illustrating relationships between capacity and internal pressure of the battery according to a fifth embodiment.

FIG. 19 is a graph illustrating a relationship between the capacity and the internal pressure of each of a plurality of battery 2 used under different use circumstances. In a condition A, the battery 2 has an SOC of 90% and stands at 65° C. In a condition B, the battery 2 has an SOC of 50% and stands at 65° C. It can be found that the capacity of the battery 2 under the condition A when the stop pressure $P_S$ is reached is higher than under the condition B. This may be because a higher state of charge (i.e., a higher voltage) of the battery 2, as under the condition A, can make the electrolyte more likely to decompose to generate gas. Thus, the capacity threshold needs to be set higher under a high SOC use circumstance.

Comparing the condition A and a condition C that the battery has the same SOC of 90% and stands at a lower temperature of 55° C., it can be found that the capacity when the stop pressure $P_S$ is reached under the condition A is higher than under the condition C. This may be because a higher temperature of the battery 2 can make the electrolyte of the battery 2 more likely to decompose to generate gas. Under a high temperature use circumstance, the capacity threshold needs to be set higher.

The capacity threshold may be calculated as follows. Relationships between temperatures, states of charge, and slopes and intercepts of linear functions of the battery 2 are preliminarily investigated. When a geographic region of use and a system type are externally input, an average temperature in this geographic region of use and an average state of charge are calculated. Using these calculated values, a slope and an intercept of a linear function are determined. That is, a linear function is determined. Using this linear function, the capacity when the stop pressure $P_S$ is reached is calculated. The calculated capacity is set as the capacity threshold.

Figure 20:
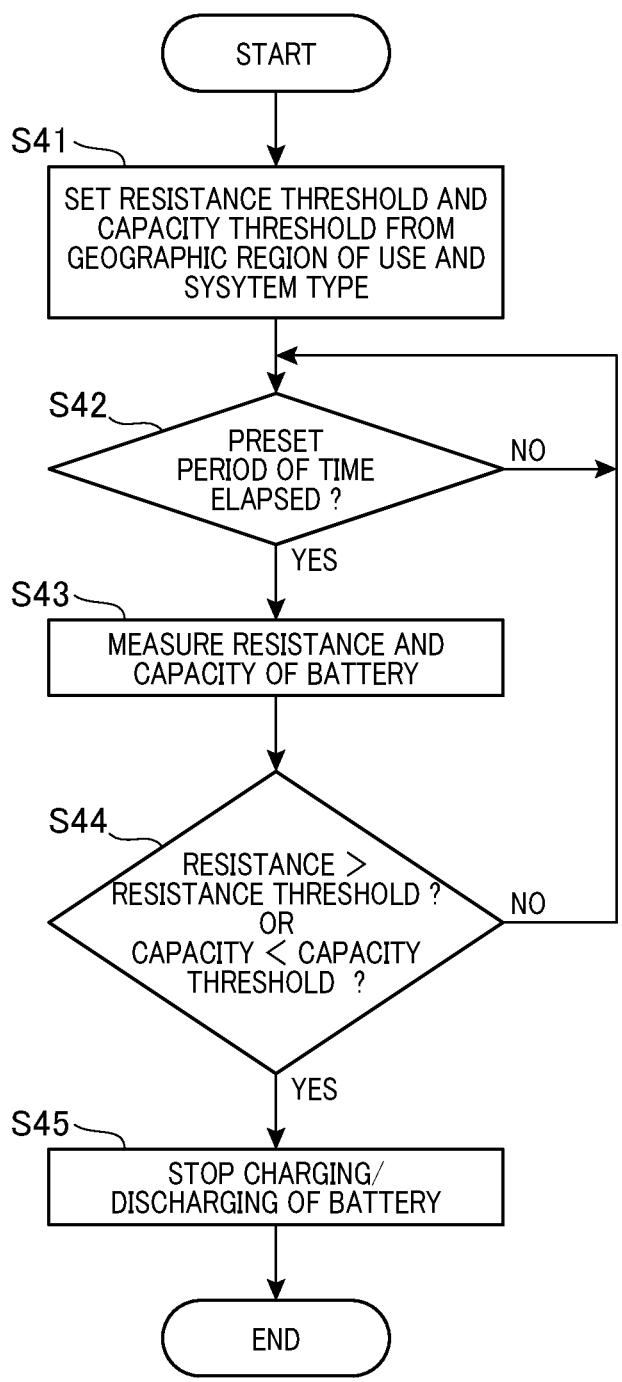
FIG. 20 is a flowchart of processing performed by a controller of the battery control system according to the fifth embodiment.

A flowchart of processing performed by the controller 3 will now be described. As shown in FIG. 20, upon initiating use of the battery 2, the controller 3, at step S41, calculates a resistance threshold and a capacity threshold using a geographic region of use and a system type of the battery 2 (e.g., information regarding an operating temperature, a state of charge, and the like) inputted by the provider or user of the battery control system 1.

Subsequently, the process flow proceeds to step S42. At step S42, the controller 3 determines whether or not a preset period of time has elapsed. If at step S42 it is determined that the preset period of time has elapsed, then the process flow proceeds to step S43. At step S43, the controller 3 measures a resistance and a capacity of the battery 2. Thereafter, the process flow proceeds to step S44. At step S44, the controller determines whether the resistance of the battery 2 has increased above the resistance threshold or the capacity of the battery 2 has decreased below the capacity threshold. If it is determined that the resistance of the battery 2 has not increased above the resistance threshold and the capacity of the battery 2 has not decreased below the capacity threshold, then the process flow returns to step S42. If it is determined that the resistance of the battery 2 has increased above the resistance threshold or the capacity of the battery 2 has decreased below the capacity threshold, then the process flow proceeds to step S45. At step S45, the controller 3 stops charging/discharging of the battery 2 as it is likely that the internal pressure of the battery 2 has reached a stop pressure $P_S$.

The present embodiment can provide not only the advantages of the second embodiment, but also the following advantage. In the present embodiment, the controller 3 includes the input calculator 33. Therefore, an optimal resistance threshold and an optimal capacity threshold can be set in response to the operating temperature and the state of charge of the battery 2. This configuration enables more accurately determining whether to stop charging/discharging of the battery 2.

Sixth Embodiment

A sixth embodiment will now be described. The sixth embodiment is different from the third embodiment in that the method of determining whether to stop charging/discharging of the battery is modified. The controller 3 includes, as in the third embodiment, a measurer 31, a stop director 32, a parameter measurer 34, and an automatic calculator 35 (see FIG. 9). The parameter measurer 34 is configured to measure parameters, such as a temperature, a state of charge and the like, of the battery 2 under a use circumstance. The automatic calculator 35 is configured to, using the measured parameters, calculate a resistance threshold and a capacity threshold.

In the present embodiment, information regarding an operating temperature and a state of charge of the battery 2 is not externally input, but acquired by the controller 3. A resistance threshold and a capacity threshold are calculated using the acquired information. When the resistance of the battery 2 has increased above the resistance threshold or when the capacity of the battery 2 has decreased below the capacity threshold, charging/discharging of the battery 2 is stopped.

Figure 21:
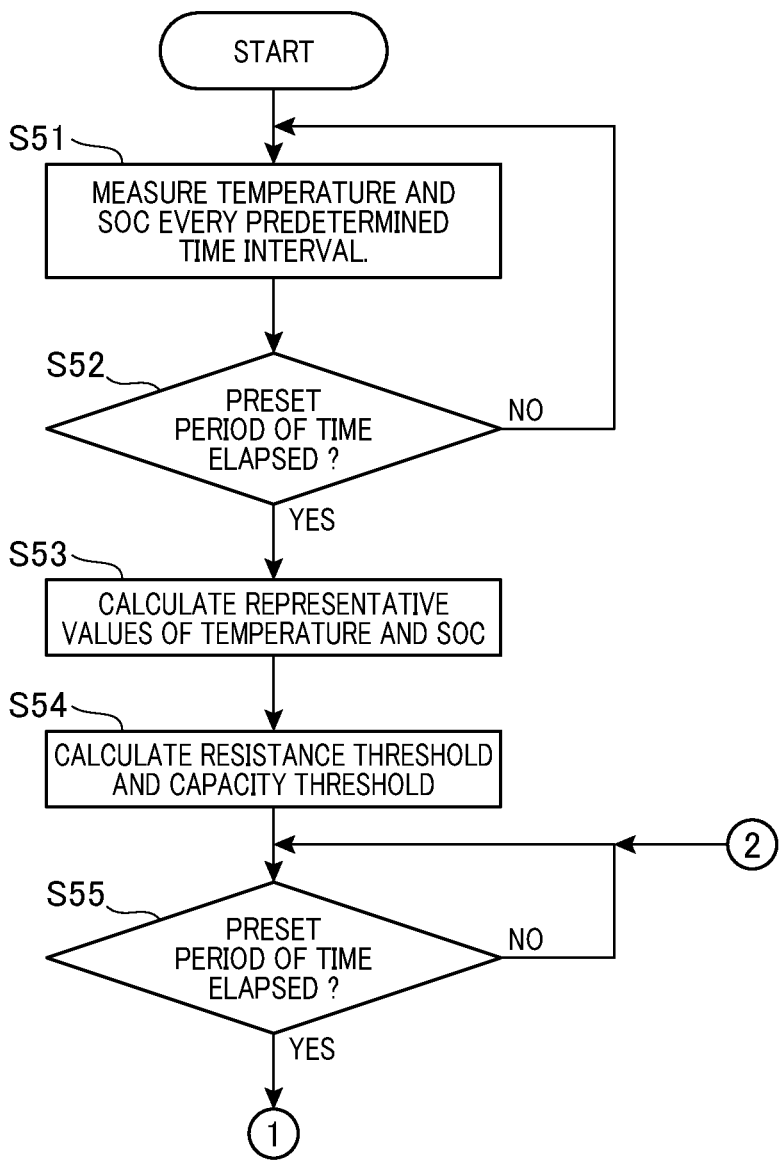
FIG. 21 is a flowchart of processing performed by a controller of the battery control system according to a sixth embodiment.
Figure 22:
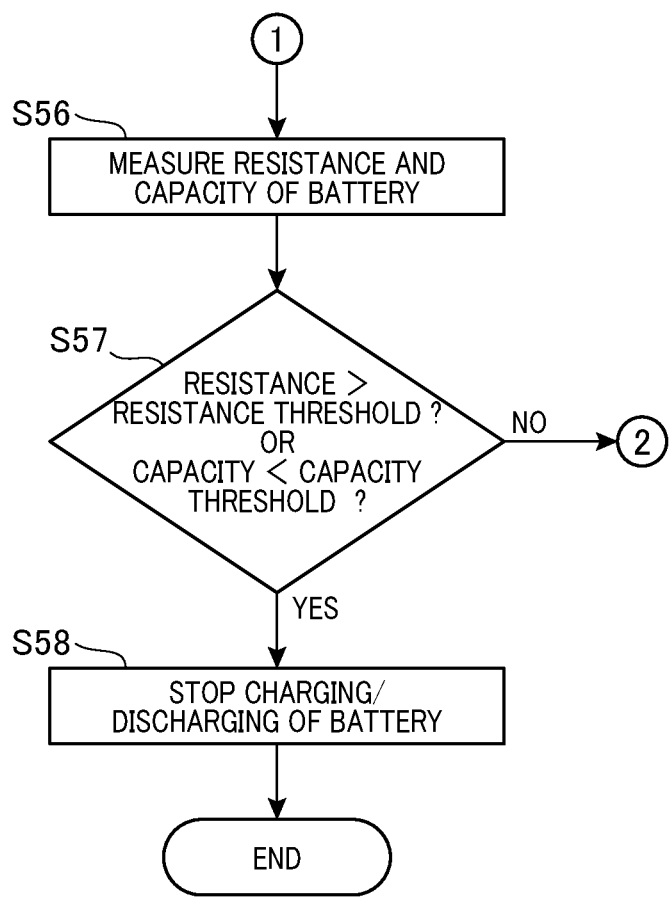
FIG. 22 is a continuation of the flowchart of FIG. 21.

A flowchart of processing performed by the controller 3 will now be described. As shown in FIGS. 21 and 22, the controller 3, at step S51, measures a temperature and a state of charge (SOC) of the battery 2 every predetermined time interval. Subsequently, at step S52, the controller 3 determines whether or not a preset period of time has elapsed. If at step S51 it is determined that the preset period of time has elapsed, then the process flow proceeds to step S53. At step S53, as in the third embodiment, the controller 3 calculates a representative value of each of the temperature and the state of charge of the battery 2.

Subsequently, the process flow proceeds to step S54. At step S54, the controller 3 calculates a resistance threshold and a capacity threshold using the representative value of each of the temperature and the state of charge of the battery 2. Thereafter, the process flow proceeds to step S55. At step S55, the controller 3 determines whether or not a preset period of time has elapsed. If at step S55 it is determined that the preset period of time has elapsed, then the process flow proceeds to step S56. At step S56, the controller 3 measures a resistance and a capacity of the battery 2.

Subsequently, the process flow proceeds to step S57. At step S57, the controller 3 determines whether the resistance of the battery 2 has increased above the resistance threshold or the capacity of the battery 2 has decreased below the capacity threshold. If it is determined that the resistance of the battery 2 has not increased above the resistance threshold and the capacity of the battery 2 has not decreased below the capacity threshold, then the process flow returns to step S55.

If it is determined that the resistance of the battery 2 has increased above the resistance threshold or the capacity of the battery 2 has decreased below the capacity threshold, then the process flow proceeds to step S58. At step S58, the controller 3 stops charging/discharging of the battery 2 as it is likely that the internal pressure of the battery 2 has reached a stop pressure $P_S$.

In addition to the advantages of the third embodiment, the present embodiment can provide the following advantages. In the present embodiment, the controller 3 includes the parameter measurer 34 and the automatic calculator 35. The automatic calculator 35 calculates a resistance threshold and a capacity threshold using parameters, such as a temperature and a state of charge of the battery 2.

With this configuration, an actual usage state of the battery 2 can be reflected to calculation of the resistance threshold and the capacity threshold. This enables more accurately calculating the resistance threshold and the capacity threshold, thereby enabling more accurately determining whether to stop charging/discharging of the battery 2.

The parameter measurer 34 is configured to regularly measure a temperature and a state of charge of the battery 2 as the parameters. The automatic calculator 35 acquires a representative value of temperature from a plurality of temperature measurements and a representative value of state of charge from a plurality of SOC measurements, and using these representative values, calculate a resistance threshold and a capacity threshold.

This configuration enables more accurately calculating the resistance threshold and the capacity threshold. That is, as the temperature and the state of charge are correlated with the resistance threshold and the capacity threshold, measuring the temperature and the state of charge enables more accurately calculating a resistance threshold and a capacity threshold. In the present embodiment, the temperature and the state of charge are measured plural times. The resistance threshold and the capacity threshold are calculated from a plurality of temperature measurements and a plurality of SOC measurements. This results in increased reliability of these thresholds.

In the present embodiment, as in the third embodiment, the temperature and the state of charge are regularly measured for at least one year. The representative values are calculated using the acquired measurements.

With this configuration, a large number of measurements can be acquired. Therefore, the reliability of the representative values can be increased, which can increase the reliability of the resistance threshold.

Seventh Embodiment

A seventh embodiment will now be described. The seventh embodiment is different from each of the third and sixth embodiments in that the method of determining whether to stop charging/discharging of the battery is modified. The controller 3, as in the third and sixth embodiments, includes a measurer 31, a stop director 32, a parameter measurer 34, and an automatic calculator 35 (see FIG. 9). The parameter measurer 34 is configured to regularly measure a temperature and a state of charge of the battery 2 as parameters. The automatic calculator 35 is configured to enumerate combinations of temperature and state of charge measurements belonging to a respective one of a plurality of domains and calculates a frequency of measurement on the one of the plurality of domains, that is, the number of combinations of temperature and state of charge measurements belonging to the one of the plurality of domains divided by the total number of combinations of temperature and state of charge measurements.

More specifically, as shown in the following table 1, the automatic calculator 35 enumerates combinations of temperature and state of charge measurements in each of a plurality of domains including a first domain, a second domain, etc. The first domain is specified by a temperature range of 0 to 10° C. and a state of charge range of 0 to 10%. The second domain is specified by a temperature range of 0 to 10° C. and a state of charge range of 10 to 20%. The automatic calculator 35 calculates a frequency of measurement for each combination of temperature and state of charge measurements. Further, the automatic calculator 35 pre-stores a relationship between the resistance and the internal pressure of the battery 2, as shown in FIG. 6, for each of the plurality of domains. As described above, each relationship between the resistance and the internal pressure of the battery 2 can be quantified by a linear function or the like.

TABLE 1

| Temperature-SOC domain | Frequency | Internal pressure as function of resistance |
|---|---|---|
| 0-10° C., 0-10% | | f(r(1010)) |
| 0-10° C., 10-20% | | f(r(1020)) |
| ■ | | ■ |
| ■ | | ■ |
| ■ | | ■ |
| 10-20° C., 0-10% | | f(r(2010)) |
| 10-20° C., 10-20% | | f(r(2020)) |
| ■ | | ■ |
| (m − 1)-m ° C., (n − 1)-n % | a(mn) | f(r(mn)) |
| ■ | | ■ |

Figure 23:
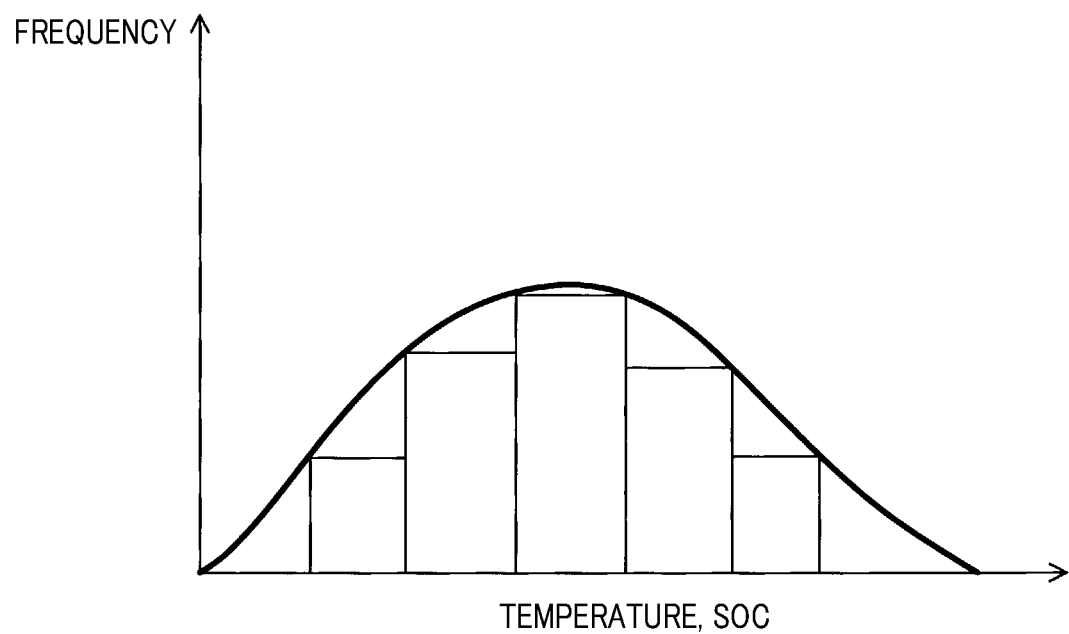
FIG. 23 is a schematic graph illustrating a frequency distribution of temperature and state of charge of the battery according to a seventh embodiment.

FIG. 23 illustrates an example of a frequency distribution. This frequency distribution was acquired by regularly measuring a temperature and a state of charge of the battery 2. Frequency information is acquired, such as information that a frequency of measurement on a domain having a temperature range of 20 to 30° C. and a state of charge range of 50 to 60% is the highest one and a frequency of measurement on a domain having a temperature range of 10 to 20° C. and a state of charge range of 60 to 70% is the second highest one.

Figure 24:
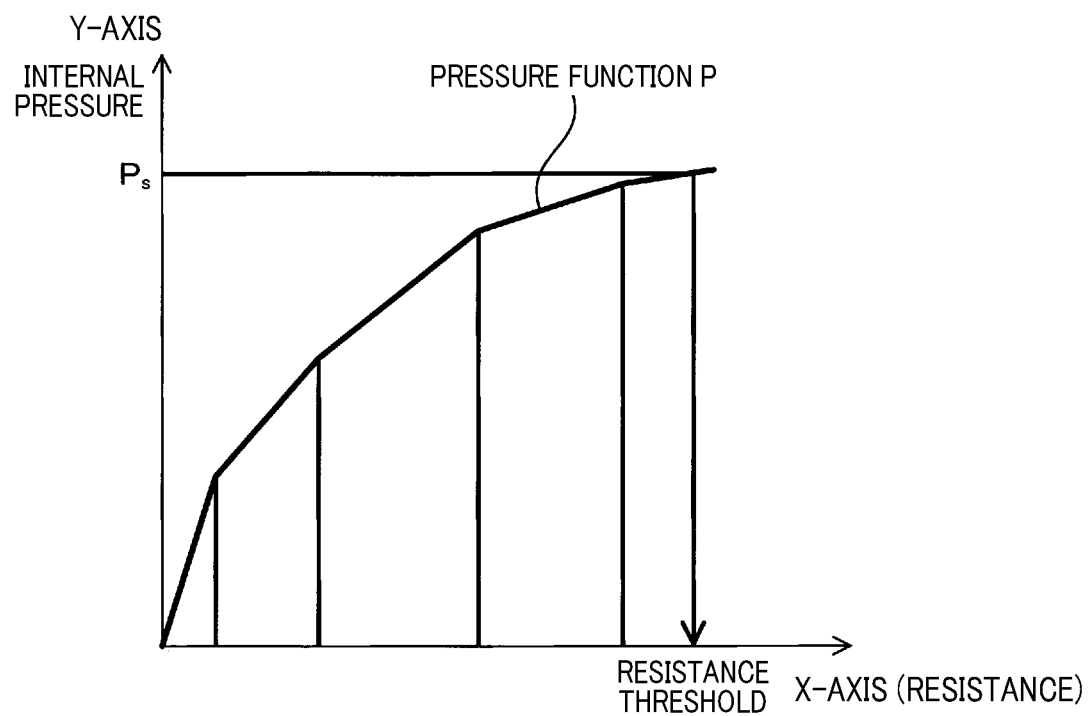
FIG. 24 is an illustration of calculating a resistance threshold according to the seventh embodiment.

The automatic calculator 35 calculates a pressure function P as shown in FIG. 24 from the acquired frequency information. The pressure function P is expressed as:

$$P=\alpha \Sigma a(mn) \cdot f(r(mn)),$$

where a(mn) represents a frequency of measurement on a domain defined by a temperature range of m−10 to m ° C. and a state of charge range of n−10 to n %, f(r(mn)) represents an internal pressure as a function of the resistance under the condition of temperature and state of charge corresponding to this domain, and a represents a constant corresponding to a total operating time.

In FIG. 24, the pressure function P is a sum of internal pressures corresponding to the resistance under a plurality of conditions of temperature and state of charge, taking into account actual frequencies of measurement. A length of each line in an X-axis direction corresponds to an integration of resistance increase rates taking into account the frequencies. A length of each line in a Y-axis direction corresponds to an integration of internal pressure increase rates. The automatic calculator 35 acquires the pressure function P and calculates the resistance when the stop pressure $P_S$ is reached, as a resistance threshold.

The present embodiment can provide the following similar advantages to those of the third and sixth embodiments. In the present embodiment, the resistance threshold is calculated using the frequency information regarding the temperature and state of charge measurements. Therefore, the frequency information can be reflected to calculation of the resistance threshold. This enables more accurately calculating the resistance threshold, thereby enabling more accurately determining whether to stop charging/discharging of the battery 2.

Eighth Embodiment

An eighth embodiment will now be described. The eighth embodiment is different from the seventh embodiment in that the method of determining whether to stop charging/discharging of the battery is modified. The controller 3 includes, as in the seventh embodiment, a measurer 31, a stop director 32, a parameter measurer 34, and an automatic calculator 35 (see FIG. 9). The automatic calculator 35 is configured to enumerate combinations of temperature and state of charge measurements belonging to a respective one of a plurality of domains and calculates a frequency of measurement on the one of the plurality of domains, that is, the number of combinations of temperature and state of charge measurements belonging to the one of the plurality of domains divided by the total number of combinations of temperature and state of charge measurements. Further, the automatic calculator 35 calculates a resistance threshold using a relationship between the capacity and the internal pressure of the battery 2 and a frequency of measurement on a respective one of the plurality of domains and As in the seventh embodiment, as shown in the following table 2, the automatic calculator 35 enumerates combinations of temperature and state of charge measurements on a respective one of a plurality of domains including a first domain, a second domain, etc. For example, the first domain is defined by a temperature range of 0 to 10° C. and a state of charge range of 0 to 10%. The second domain is defined by a temperature range of 0 to 10° C. and a state of charge range of 10 to 20%. The automatic calculator 35 calculates a frequency of measurement on the one of the plurality of domains, that is, the number of combinations of temperature and state of charge measurements belonging to the one of the plurality of domains divided by the total number of combinations of temperature and state of charge measurements. Further, the automatic calculator 35 pre-stores a relationship between the capacity and the internal pressure of the battery 2 on a respective one of the plurality of domains. Each relationship between the capacity and the internal pressure of the battery 2 can be quantified by a linear function or the like as shown in FIG. 19.

TABLE 2

| Temperature-SOC domain | Frequency | Internal pressure as function of capacity |
|---|---|---|
| 0-10° C., 0-10% | | f(q(1010)) |
| 0-10° C., 10-20% | | f(q(1020)) |
| ■ | | ■ |
| ■ | | ■ |
| 10-20° C., 0-10% | | f(q(2010)) |
| 10-20° C., 10-20% | | f(q(2020)) |

TABLE 2-continued

| Temperature-SOC domain | Frequency | Internal pressure as function of capacity |
|---|---|---|
| ■ | | ■ |
| (m − 1)-m ° C., (n − 1)-n % | a(mn) | f(q(mn)) |
| ■ | | ■ |
| ■ | | |

Figure 25:
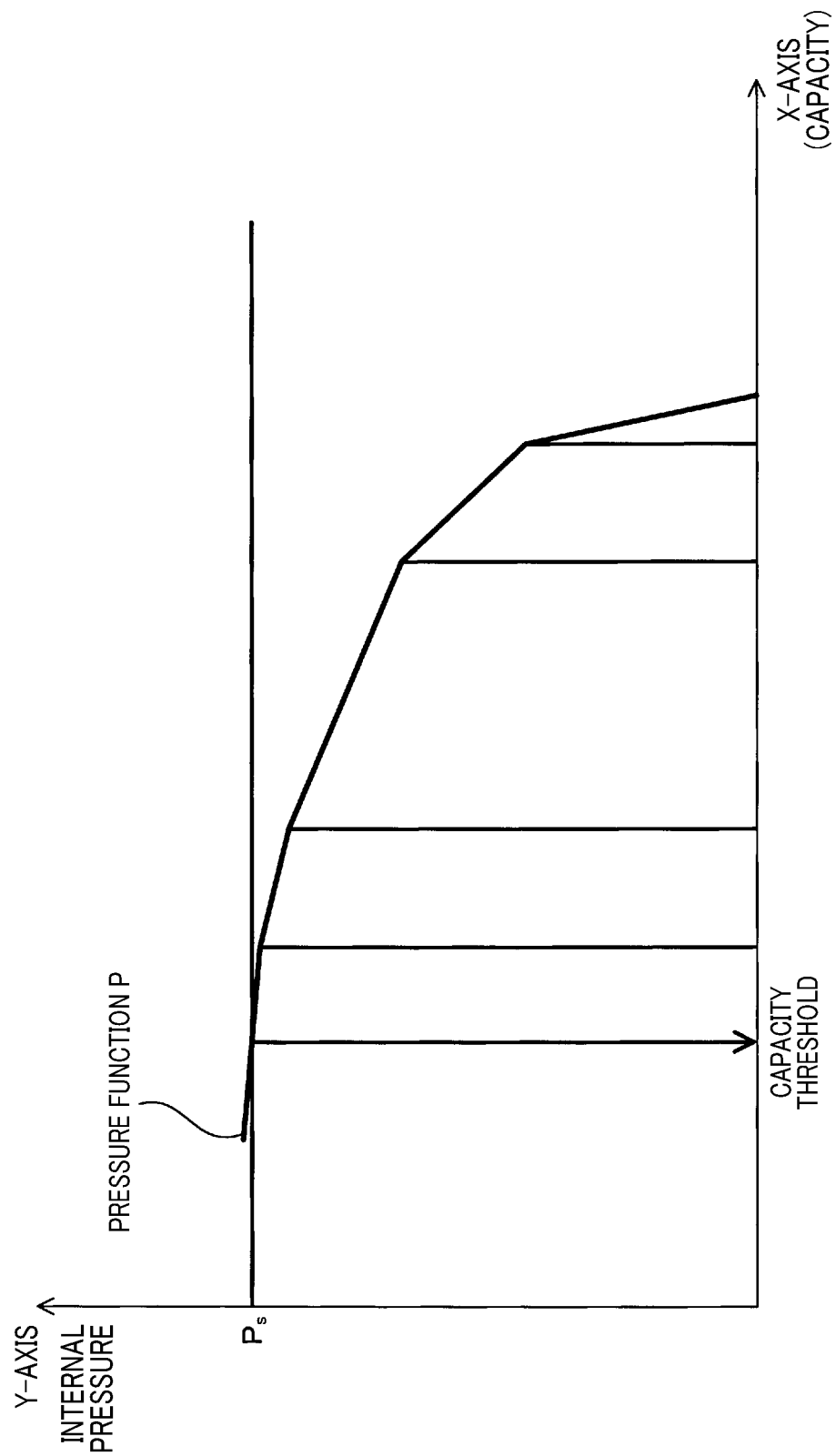
FIG. 25 is an illustration of calculating a capacity threshold according to an eighth embodiment.

The automatic calculator 35 calculates a pressure function P as shown in FIG. 25 from the acquired frequency information. The pressure function P is expressed as:

$$P=\alpha\Sigma a(mn)\cdot f(q(mn)),$$

where a(mn) represents a frequency of measurement on a domain defined by a temperature range of m−10 to m ° C. and a state of charge range of n−10 to n %, f(q(mn)) represents an internal pressure as a function of the capacity under the condition of temperature and state of charge corresponding to this domain, and a represents a constant corresponding to a total operating time. The automatic calculator 35 acquires the pressure function P and calculates the capacity when the stop pressure $P_S$ is reached, as a capacity threshold.

The present embodiment can provide the following similar advantages to those of the seventh embodiment. In the present embodiment, the capacity threshold is calculated using the frequency information regarding the temperature and state of charge measurements. Therefore, the frequency information can be reflected to calculation of the capacity threshold. This enables more accurately calculating the capacity threshold, thereby enabling more accurately determining whether to stop charging/discharging of the battery 2.

Although the invention has been described herein with reference to specific embodiments and examples, it is not necessarily intended to limit the scope of the invention to the specific embodiments and examples disclosed. Thus, in addition to claiming the subject matter literally as defined in the appended claims, all modifications, alterations, and equivalents to which the applicant is entitled by law, are herein expressly reserved by the following claims.

What is claimed is:

1. A battery control system comprising:
a secondary battery within which gas is generated with use, the secondary battery including a valve that opens in response to internal pressure reaching an opening pressure; and
a controller configured to control charging/discharging of the secondary battery, the controller comprising:
a measurer configured to measure an internal resistance of the secondary battery that has degraded with use; and
a stop director configured to stop charging/discharging of the secondary battery when the internal resistance of the secondary battery has exceeded a predetermined resistance threshold, wherein
the internal pressure of the secondary battery is an increasing function of the internal resistance of the secondary battery, and
the internal pressure of the secondary battery corresponding to the predetermined resistance threshold is less than the opening pressure.

2. The battery control system according to claim 1, wherein
the controller further comprises an input calculator configured to calculate the internal resistance threshold using information regarding a temperature and a state of charge of the secondary battery under a use circumstance, the information being externally input.

3. The battery control system according to claim 1, wherein
the controller further comprises:
a parameter measurer configured to measure at least one parameter of the secondary battery under a use circumstance; and
an automatic calculator configured to calculate the internal resistance threshold using a measurement of the at least one parameter.

4. The battery control system according to claim 3, wherein
the parameter measurer is configured to regularly measure a temperature and a state of charge of the secondary battery as the at least one parameter, and
the automatic calculator is configured to acquire a representative value of temperature from a plurality of temperature measurements and a representative value of state of charge from a plurality of state of charge measurements, and using these representative values, calculate the internal resistance threshold.

5. The battery control system according to claim 4, wherein
the parameter measurer is configured to regularly measure the temperature and the state of charge of the secondary battery for at least one year.

6. A battery control system comprising:
a secondary battery within which gas is generated with use, the secondary battery including a valve that opens in response to internal pressure reaching an opening pressure; and
a controller configured to control charging/discharging of the secondary battery, the controller comprising:
a measurer configured to measure an internal resistance and a capacity of the secondary battery that has degraded with use; and
a stop director configured to stop charging/discharging of the secondary battery, not only in response to a measurement of the internal resistance of the secondary battery exceeding a predetermined resistance threshold, but also in response to a measurement of the capacity of the secondary battery decreasing below a predetermined capacity threshold, wherein
the internal pressure of the secondary battery is an increasing function of the internal resistance of the secondary battery,
the internal pressure of the secondary battery corresponding to the predetermined resistance threshold is less than the opening pressure,
the internal pressure of the secondary battery is also a decreasing function of the capacity of the secondary battery, and
the internal pressure of the secondary battery corresponding to the predetermined capacity threshold is less than the opening pressure.

7. The battery control system according to claim 6, wherein
the controller further comprises an input calculator configured to calculate the internal resistance threshold and the capacity threshold using information regarding a temperature and a state of charge of the secondary battery under a use circumstance, the information being externally input.

8. The battery control system according to claim 6, wherein the controller further comprises:

a parameter measurer configured to measure at least one parameter of the secondary battery under a use circumstance; and an automatic calculator configured to calculate the internal resistance threshold and the capacity threshold using a measurement of the at least one parameter.

9. The battery control system according to claim 8, wherein the parameter measurer is configured to regularly measure a temperature and a state of charge of the secondary battery as the at least one parameter, and the automatic calculator is configured to acquire a representative value of temperature from a plurality of temperature measurements and a representative value of state of charge from a plurality of state of charge measurements, and using these representative values, calculate the internal resistance threshold and the capacity threshold.

10. The battery control system according to claim 9, wherein the parameter measurer is configured to regularly measure the temperature and the state of charge of the secondary battery for at least one year.

* * * * *